(12) United States Patent
Ito

(10) Patent No.: US 11,215,889 B2
(45) Date of Patent: Jan. 4, 2022

(54) ELECTRO-OPTICAL DEVICE, AND METHOD OF MANUFACTURING ELECTRO-OPTICAL DEVICE

(71) Applicant: SEIKO EPSON CORPORATION, Tokyo (JP)

(72) Inventor: Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 168 days.

(21) Appl. No.: 16/663,408

(22) Filed: Oct. 25, 2019

(65) Prior Publication Data

US 2020/0133086 A1 Apr. 30, 2020

(30) Foreign Application Priority Data

Oct. 26, 2018 (JP) .............................. JP2018-201477

(51) Int. Cl.
| | |
|---|---|
| *H01L 27/12* | (2006.01) |
| *H01L 29/786* | (2006.01) |
| *G02F 1/1362* | (2006.01) |
| *G02F 1/1368* | (2006.01) |
| *G02F 1/1335* | (2006.01) |

(52) U.S. Cl.
CPC ...... *G02F 1/136286* (2013.01); *G02F 1/1368* (2013.01); *G02F 1/133526* (2013.01); *G02F 1/136213* (2013.01); *H01L 27/124* (2013.01); *H01L 27/1288* (2013.01); *H01L 29/78633* (2013.01); *G02F 1/136295* (2021.01)

(58) Field of Classification Search
CPC ......... G02F 1/136286; G02F 1/133526; G02F 1/136213; G02F 1/1368; G02F 1/136295; H01L 27/124; H01L 27/1288
See application file for complete search history.

(56) References Cited

U.S. PATENT DOCUMENTS 6,330,112 B1 * 12/2001 Kaise .................. H04N 9/3108
359/621
6,344,929 B1 * 2/2002 Sugawara ............ G02B 27/283
348/E9.027

(Continued)

FOREIGN PATENT DOCUMENTS

JP 2000-305171 A 11/2000
JP 2006-332314 A 12/2006
(Continued)

*Primary Examiner* — Shaun M Campbell
(74) *Attorney, Agent, or Firm* — Oliff PLC

(57) ABSTRACT

An electro-optical device includes a pixel electrode having translucency, a wiring layer including a translucent portion having translucency configured to overlap the pixel electrode in plan view in a thickness direction of the pixel electrode, and a wiring portion including a plurality of wirings arranged in a periphery of the translucent portion in the plan view, an insulating layer arranged between the pixel electrode and the wiring layer, and including a lens surface having a curved shape, a lens layer having translucency arranged between the pixel electrode and the insulating layer, and arranged on the insulating layer to be in contact with the lens surface, a first mark formed of a same layer as a part of the plurality of wirings of the wiring layer, and a second mark arranged in contact with the insulating layer on the lens layer side as viewed from the insulating layer.

10 Claims, 17 Drawing Sheets

(56) References Cited

U.S. PATENT DOCUMENTS

| | | | |
|---|---|---|---|
| 2006/0215269 A1* | 9/2006 | Abe | G02B 3/0012 |
| | | | 359/619 |
| 2015/0041833 A1* | 2/2015 | Nimura | H01L 29/78633 |
| | | | 257/88 |
| 2015/0331280 A1* | 11/2015 | Wakabayashi | G02F 1/1339 |
| | | | 349/57 |
| 2016/0018567 A1* | 1/2016 | Ito | G02B 3/0012 |
| | | | 359/793 |
| 2018/0173048 A1* | 6/2018 | Ito | G02F 1/13394 |
| 2020/0264481 A1* | 8/2020 | Ito | G09G 3/3648 |
| 2021/0157194 A1* | 5/2021 | Ito | G02F 1/13624 |
| 2021/0181573 A1* | 6/2021 | Izawa | G02F 1/1368 |
| 2021/0286225 A1* | 9/2021 | Izawa | G02F 1/136209 |

FOREIGN PATENT DOCUMENTS

| | | |
|---|---|---|
| JP | 2007-093674 A | 4/2007 |
| JP | 2015-034860 A | 2/2015 |
| JP | 2015-228040 A | 12/2015 |
| JP | 2016-024206 A | 2/2016 |
| JP | 2018-100994 A | 6/2018 |

* cited by examiner

ELECTRO-OPTICAL DEVICE, AND METHOD OF MANUFACTURING ELECTRO-OPTICAL DEVICE

The present application is based on, and claims priority from JP Application Serial Number 2018-201477, filed Oct. 26, 2018, the disclosure of which is hereby incorporated by reference herein in its entirety.

BACKGROUND

1. Technical Field

The present disclosure relates to an electro-optical device and a method of manufacturing an electro-optical device.

2. Related Art

An electro-optical device such as a liquid crystal device is used in an electronic apparatus such as a projector. In JP-A-2015-34860, an electro-optical device, which includes an element substrate, a counter substrate, and a liquid crystal layer arranged between the element substrate and the counter substrate, is disclosed.

The element substrate described in JP-A-2015-34860 includes pixel electrodes, a light shielding layer having openings through which light passes, and microlens arrays, which are arranged between the pixel electrodes and the light shielding layer and overlap the plurality of pixel electrodes in plan view. By providing the microlens arrays, light that obliquely enter the liquid crystal layer can be reduced.

In a method of manufacturing the element substrate described in JP-A-2015-34860, the microlens arrays are formed by forming a plurality of protruding portions, which are away from each other on the light shielding layer and each have a substantially spherical shape. However, it is not easy to overlap the plurality of protruding portions with the plurality of openings in plan view. Thus, there is a problem in that positioning accuracy of the plurality of protruding portions and the plurality of openings is liable to be degraded, and that a long time period is required for the positioning.

SUMMARY

According to one aspect of the present disclosure, an electro-optical device includes a pixel electrode having translucency, a wiring layer including a translucent portion having translucency configured to overlap the pixel electrode in plan view in a thickness direction of the pixel electrode, and a wiring portion including a plurality of wirings arranged in a periphery of the translucent portion in the plan view, an insulating layer arranged between the pixel electrode and the wiring layer and including a lens surface having a curved shape, a lens layer having translucency arranged between the pixel electrode and the insulating layer, and arranged on the insulating layer to be in contact with the lens surface, a first mark formed of a same layer as a part of the plurality of wirings of the wiring layer, and a second mark arranged in contact with the insulating layer on the lens layer side as viewed from the insulating layer.

According to one aspect of the present disclosure, a method of manufacturing an electro-optical device, includes forming a wiring layer including a translucent portion having translucency and a wiring portion including a plurality of wirings arranged in a periphery of the translucent portion, forming a first mark formed of a same layer as a part of the plurality of wirings on the wiring layer, forming on the wiring layer an insulating layer having translucency including a lens surface having a curved shape, forming a second mark in contact with the insulating layer on an opposite side of the insulating layer from the wiring layer, forming a lens layer having translucency in contact with the lens surface on an opposite side of the insulating layer from the wiring layer, and forming a pixel electrode having translucency on an opposite side of the lens layer from the insulating layer.

DESCRIPTION OF EXEMPLARY EMBODIMENTS

Figure 1:
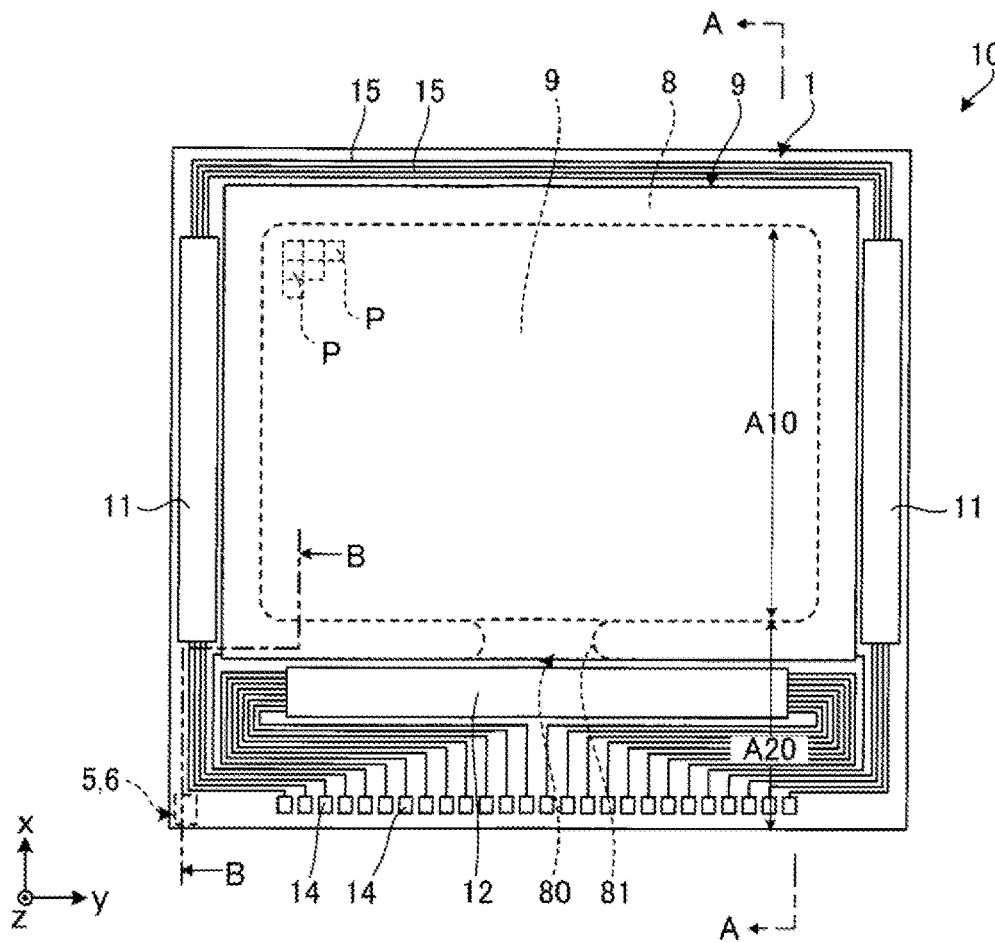
FIG. 1 is a plan view schematically illustrating an electro-optical device according to a first exemplary embodiment.

Preferred exemplary embodiments of the present disclosure are described below with reference to the accompanying drawings. Note that, in the drawings, dimensions and scales of sections differ from actual dimensions and scales as appropriate, and some of the sections are schematically illustrated for easy understanding. The scope of the present disclosure is not limited to these exemplary embodiments unless otherwise stated to limit the disclosure in the following description. Note that, in the present specification, a state of being "parallel" refers to a state in which one of two planes or lines is inclined with respect to the other within a range of ±3 degrees as well as a state in which the two planes or lines are completely parallel with each other.

1. Electro-Optical Device

1-1. First Exemplary Embodiment

As an example of an electro-optical device according to the present disclosure, an active matrix type liquid crystal display device is given.

1-1a. Basic Configuration

Figure 2:
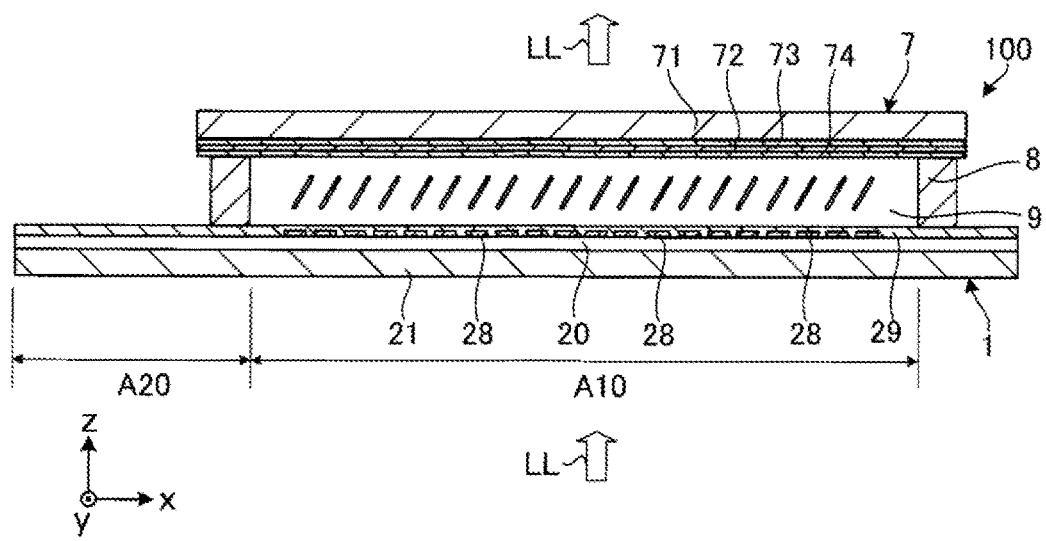
FIG. 2 is a cross-sectional view schematically illustrating the electro-optical device according to the first exemplary embodiment.

FIG. 1 is a plan view schematically illustrating an electro-optical device 100 according to a first exemplary embodiment. FIG. 2 is a cross-sectional view schematically illustrating the electro-optical device 100 according to the first exemplary embodiment, which is taken along the line A-A in FIG. 2. Note that, in the following, for convenience of the description, an x axis, a y axis, and a z axis, which are orthogonal to one another in FIG. 1 and FIG. 2, are used as appropriate.

The electro-optical device 100 illustrated in FIG. 1 and FIG. 2 is a transmissive-type liquid crystal display device. As illustrated in FIG. 2, the electro-optical device 100 includes an element substrate 1 having translucency, a counter substrate 7 having translucency, a sealing member 8 having a frame-like shape, and a liquid crystal layer 9. The sealing member 8 is arranged between the element substrate 1 and the counter substrate 7. The liquid crystal layer 9 is arranged in a region surrounded by the element substrate 1, the counter substrate 7, and the sealing member 8. Here, a direction in which the element substrate 1, the liquid crystal layer 9, and the counter substrate 7 are arrayed is the z direction, and a surface of the element substrate 1 is parallel with a x-y plane. The term "in plan view" refers to a state in which a component is viewed in the z direction parallel with a thickness direction of a pixel electrode 28 of the element substrate 1 described later.

In the present exemplary embodiment, description is made on a case where light LL enters the electro-optical device 100 from the element substrate 1, passes through the liquid crystal layer 9, and is emitted from the counter substrate 7. Note that, in the present specification, incident light entering the electro-optical device 100, light passing through the electro-optical device 100, and emission light emitted from the electro-optical device 100 are collectively referred to as the light LL without distinction. The light LL is visible light. In the present specification, translucency refers to transmittance with respect to visible light, and it is preferred that visible light transmittance be 50% or higher.

As illustrated in FIG. 1, the electro-optical device 100 has a quadrilateral shape in plan view. However, the shape of the electro-optical device 100 in plan view is not limited thereto, and may be, for example, a circular shape.

As illustrated in FIG. 1, the element substrate 1 has a size encompassing the counter substrate 7 in plan view. As illustrated in FIG. 2, the element substrate 1 includes a base plate 21, a plurality of pixel electrodes 28, and an alignment film 29. The base plate 21 is formed of a flat plate having translucency and an insulating property. The pixel electrodes 28 has translucency, and is formed of a transparent electrode material such as indium tin oxide (ITO) or indium zinc oxide (IZO). The alignment film 29 is positioned on a side closest to the liquid crystal layer 9 in the element substrate 1, and aligns liquid crystal molecules of the liquid crystal layer 9. As a constituent material of the alignment film 29, for example, polyimide, silicon oxide, and the like are exemplified. A wiring layer 20 and the like are arranged between the base plate 21 and the pixel electrodes 28. Description is made on the wiring layer 20 and the like later.

As illustrated in FIG. 2, the counter substrate 7 includes a base member 71, an insulating layer 72, a common electrode 73, and an alignment film 74. The base member 71, the insulating layer 72, the common electrode 73, and the alignment film 74 are arrayed in the stated order. The alignment film 74 is positioned on a side closest to the liquid crystal layer 9. The base member 71 is formed of a flat plate having translucency and an insulating property. The base member 71 is formed of, for example, glass or quartz. The common electrode 73 is laminated on the base member 71 through intermediation of the insulating layer 72 formed of a translucent insulating material member. The common electrode 73 is formed of a transparent electrode material such as ITO or IZO. The alignment film 74 aligns the liquid crystal molecules of the liquid crystal layer 9. As a constituent material of the alignment film 74, for example, polyimide, silicon oxide, and the like are exemplified.

The sealing member 8 is formed of, for example, an adhesive containing various types of curable resins such as epoxy resin. The sealing member 8 is fixed to the element substrate 1 and the counter substrate 7. An injection port 81 for injecting a liquid crystal material containing liquid crystal molecules is formed in a part of the sealing member 8, and the injection port 81 is sealed by an encapsulant 80 formed of various types of resin materials.

The liquid crystal layer 9 contains liquid crystal molecules having positive or negative dielectric anisotropy. The liquid crystal layer 9 is interposed between the element substrate 1 and the counter substrate 7 such that the liquid crystal molecules are in contact with both the alignment film 29 and the alignment film 74. The alignment of the liquid crystal layer that the liquid crystal layer 9 changes in accordance with voltage to be applied to the liquid crystal layer 9. The liquid crystal layer 9 is capable of performing grayscale display by modulating light in accordance with the applied voltage.

As illustrated in FIG. 1, on a surface of the element substrate 1 on the counter substrate 7 side, a plurality of scanning line drive circuits 11, a plurality of signal line driving circuits 12, and a plurality of external terminals 14 are arranged. The external terminal 14 is coupled with wirings 15 guided from the scanning line driving circuit 11 and the signal line driving circuit 12.

The electro-optical device 100 having the above-mentioned configuration includes a display region A10 for display an image and the like, and a peripheral region A20 surrounding the display region A10 in plan view. The display region A10 includes a plurality of pixels P arrayed in a matrix pattern. One pixel electrode 28 is arranged in each of the pixels P. In the peripheral region A20, the scanning line driving circuits 11, the signal line driving circuits 12, and the like are arranged.

1-1b. Electrical Configuration

Figure 3:
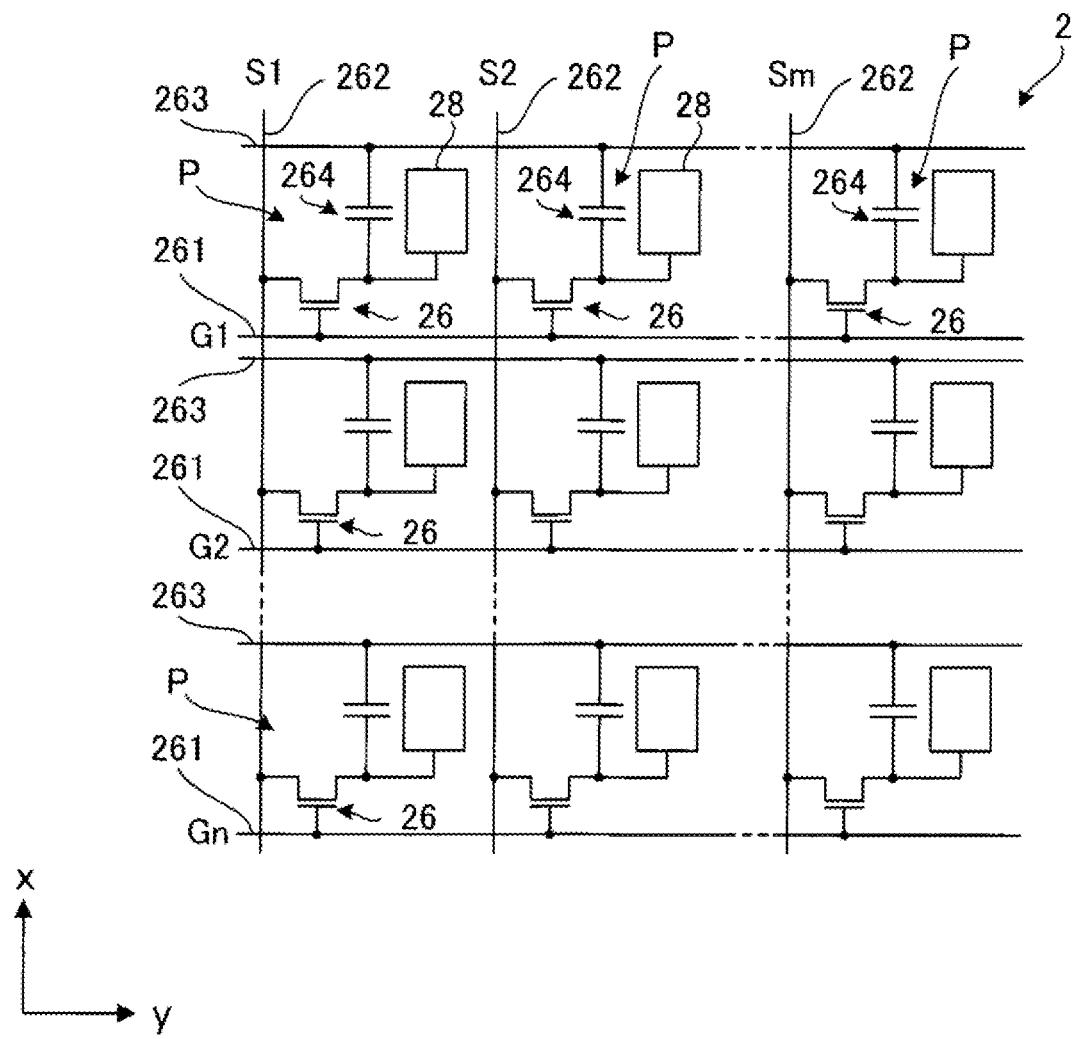
FIG. 3 is an equivalent circuit diagram illustrating an electrical configuration of an element substrate in the first exemplary embodiment.

FIG. 3 is an equivalent circuit diagram illustrating an electrical configuration of the element substrate 1 in the first exemplary embodiment. As illustrated in FIG. 3, on the element substrate 1 are formed n pieces of scanning lines 261, m pieces of signal lines 262, and n pieces of capacitor lines 263. Note that both n and m are integers of 2 or greater. A TFT 26 serving as a switching element is arranged correspondingly to each of the intersections between then pieces of scanning lines 261 and them pieces of signal lines 262.

The n pieces of scanning lines 261 extend in the y direction, and are arrayed in the x direction at an equal interval. The scanning line 261 is electrically coupled to the gate electrode of the TFT 26. The n pieces of scanning lines 261 are electrically coupled to the scanning line driving circuits 11 illustrated in FIG. 1. On the n pieces of scanning lines 261, scanning signals G1, G2, . . . , and Gn are line-sequentially supplied from the scanning line driving circuits 11.

The m pieces of signal lines 262 illustrated in FIG. 3 extend in the x direction, and are arrayed in the y direction at an equal interval. The signal line 262 is electrically coupled to the source electrode of the TFT 26. The m pieces of signal lines 262 are electrically coupled to the signal line driving circuits 12 illustrated in FIG. 1. On the m pieces of signal lines 262, image signals S1, S2, . . . , Sm are simultaneously supplied from the signal line driving circuits 12 illustrated in FIG. 1.

The n pieces of scanning lines 261 and the m pieces of signal lines 262 illustrated in FIG. 3 are insulated from each other, and are formed in a lattice-like pattern in plan view. A region surrounded by two adjacent scanning lines 261 and two adjacent signal lines 262 corresponds to the pixel P. One pixel electrode 28 is arranged in each of the pixels P. The pixel electrode 28 is electrically coupled to the TFT 26.

The n pieces of capacitor lines 263 extend in the y direction, and are arrayed in the x direction at an equal interval. The n pieces of capacitor lines 263 are insulated from the plurality of signal lines 262 and the plurality of scanning lines 261, and are formed apart from these lines. A fixed potential such as a ground potential is applied to the capacitor lines 263. A storage capacitor 264 is arranged in parallel to a liquid crystal capacitor, between the capacitor line 263 and the pixel electrode 28, so as to prevent leakage of charges held in the liquid crystal capacitor.

The scanning signals G1, G2, . . . , and Gn become sequentially active, and the n pieces of scanning lines 261 are sequentially selected. Then, the TFT 26 coupled to the selected scanning line 261 is turned to be an on state. Then, the image signals S1, S2, . . . , and Sm having magnitudes commensurate with the grayscale to be displayed are transmitted, via the m pieces of signal lines 262, to the pixel P corresponding to the selected scanning line 261, and are then applied to the pixel electrodes 28. With this, a voltage in accordance with the grayscale to be displayed is applied to the liquid crystal capacitor formed between the pixel electrode 28 and the common electrode 73 of the counter substrate 7 illustrated in FIG. 2, and the alignment of the liquid crystal molecules changes in accordance with the applied voltage. The applied voltage is held by the storage capacitor 264. The grayscale display can be performed by the light LL modulated due to such change in the alignment of the liquid crystal molecules.

1-1c. Configuration of Element Substrate 1

Figure 4:
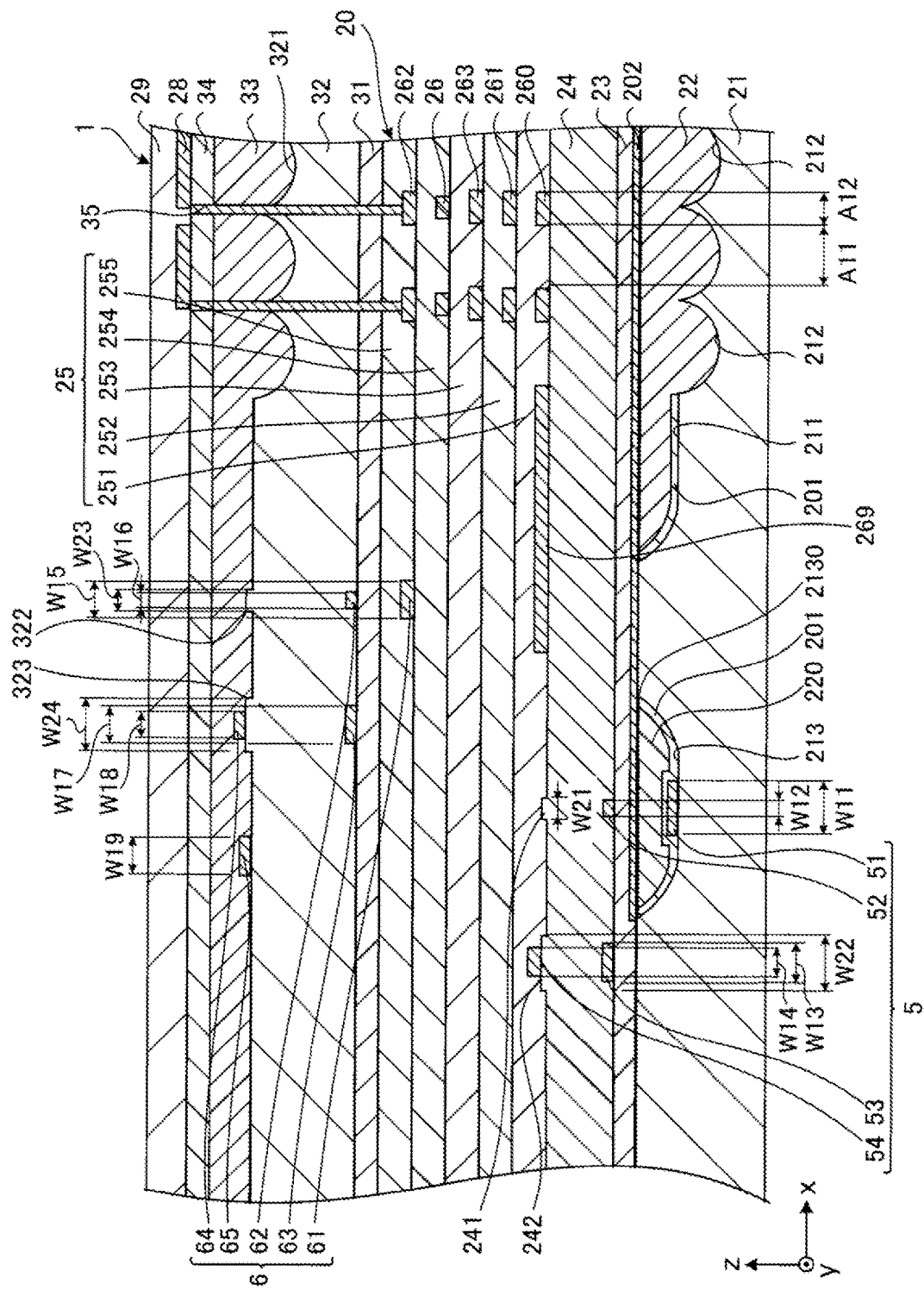
FIG. 4 is a cross-sectional view schematically illustrating a configuration of the element substrate in the first exemplary embodiment.

FIG. 4 is a cross-sectional view schematically illustrating a configuration of the element substrate 1 in the first exemplary embodiment, which is taken along the line B-B in FIG. 1. The element substrate 1 includes the base plate 21, a second lens layer 22, a second protective layer 23, an optical path adjusting layer 24, the wiring layer 20, a second insulating layer 31, an insulating layer 32, a lens layer 33, a first protective layer 34, the pixel electrodes 28, and the alignment film 29. The second lens layer 22, the second protective layer 23, the optical path adjusting layer 24, the wiring layer 20, the second insulating layer 31, the insulating layer 32, the lens layer 33, the first protective layer 34, and the pixel electrodes 28 are arrayed from the base plate 21 to the alignment film 29 in the stated order. Those constituent elements are formed by a publicly-known film deposition technology and the like. The base plate 21 has second lens surfaces 212, and the insulating layer 32 has lens surfaces 321. The wiring layer 20 includes translucent portions A11 through with light passes and wiring portions A12 that block light. The element substrate 1 includes a second position adjusting portion 5 and a first position adjusting portion 6 described later, which are used for adjusting a relative positional relationship of the second lens surfaces 212, the translucent portions A11, and the lens surfaces 321 in plan view at the time of manufacturing. In the present exemplary embodiment, as illustrated in FIG. 1, the second position adjusting portion 5 and the first position adjusting portion 6 are provided in the peripheral region A20, but the second position adjusting portion 5 and the first position adjusting portion 6 may be provided in the display region A10.

Base Plate 21

As illustrated in FIG. 4, the base plate 21 has translucency and an insulating property. The base plate 21 is formed of, for example, glass or quartz. The base plate 21 includes a first recessed portion 211 and a second recessed portion 213 positioned on the outer side of the first recessed portion 211 in plan view. The first recessed portion 211 and the second recessed portion 213 are recesses formed in the surface of the base plate 21 on the +z side.

The plurality of second lens surfaces 212 having a concave surface shape are provided in the bottom surface of the first recessed portion 211. The plurality of second lens surfaces 212 are arrayed so that the plurality of second lens surfaces 212 are in a matrix in the x direction and the y direction. The second lens surface 212 is formed for each of the pixel electrodes 28. In the second recessed portion 213, a first protruding portion 51 of the second position adjusting portion 5, which is described later, is arranged. A first protective film 201 formed of, for example, a silicone oxide film is arranged in a part of the first recessed portion 211 and a part of the second recessed portion 213. The first protective film 201 arranged in the second recessed portion 213 covers the first protruding portion 51. The first protective film 201 described above protects the first protruding portion 51 so as to prevent the first protruding portion 51 from being removed by etching at the time of manufacturing the element substrate 1. Note that, the first protective film 201 may be omitted. The second lens surfaces 212 may have a convex surface shape.

Second Lens Layer 22

The second lens layer 22 is arranged on the base plate 21 so as to fill the first recessed portion 211. The second lens layer 22 is contact with the second lens surfaces 212. The second lens layer 22 has translucency and an insulating property. A refractive factor of the second lens layer 22 is different from a refractive factor of the base plate 21, and the second lens surfaces 212 and the second lens layer 22 form a lens. In the present exemplary embodiment, the refractive factor of the second lens layer 22 is larger than the refractive factor of the base plate 21. The lens converges the light LL entering the element substrate 1. A constituent material of the second lens layer 22 is, for example, silicone oxide nitride.

Here, as described above, the base plate 21 includes the first recessed portion 211 and the plurality of second lens surfaces 212 having a concave surface shape, which are provided on the bottom surface of the first recessed portion 211. Adhesion between the second lens surfaces 212 and the second lens layer 22 is improved by forming the second lens surfaces 212 in the bottom surface of the first recessed portion 211, as compared to a case where the first recessed portion 211 is not provided. Thus, generation of a crack in the second lens layer 22 is suppressed, and the second lens layer 22 can be prevented from peeling from the base plate 21. A length of an optical path can be larger by providing the first recessed portion 211 to the base plate 21, as compared to a case where the first recessed portion 211 is not provided.

A filler layer 220 is arranged in the second recessed portion 213 described above. The filler layer 220 is arranged in contact with the first protective film 201 so as to fill the second recessed portion 213. The filler layer 220 has translucency and an insulating property. A constituent material of the filler layer 220 is, for example, the same as the constituent material of the second lens layer 22 described above, that is, silicone oxide nitride. Note that, the constituent material of the filler layer 220 may be different from the constituent material of the second lens layer 22.

A second protective film 202 formed of, for example, a silicone oxide film, is arranged on the second lens layer 22 and the filler layer 220. The second protective film 202 is provided so as to suppress a warp, which may be caused in the base plate 21 by annealing at the time of manufacturing the element substrate 1. Note that, the second protective film 202 may be omitted.

Second Protective Layer 23

The second protective layer 23 has translucency and an insulating property. The second protective layer 23 is arranged on the base plate 21 so as to cover the second protective film 202. In other words, the second protective layer 23 is arranged between the second lens layer 22 and the optical path adjusting layer 24 described later. By arranging the second protective layer 23 between those layers, the second lens layer 22 can be protected so as to prevent the second lens layer 22 from being etched at the time of manufacturing the element substrate 1. A crack and the like caused in the second lens layer 22 at the time of manufacturing the element substrate 1 can be suppressed by providing the second protective layer 23, as compared to a case where the second protective layer 23 is not provided. As a constituent material of the second protective layer 23, for example, an inorganic compound containing silicone is exemplified, and it is preferred that oxide silicone be contained.

Optical Path Adjusting Layer 24

The optical path adjusting layer 24 is contact with the surface of the second protective layer 23 on the +z axis side, and is arranged on the second protective layer 23. In other words, the optical path adjusting layer 24 is arranged on a side opposite to the second lens surfaces 212 as viewed from the second lens layer 22. The optical path adjusting layer 24 has translucency and an insulating property. The optical path adjusting layer 24 adjusts an optical path length of the light passing through the second lens surfaces 212. By adjusting the thickness of the optical path adjusting layer 24, a position at which the light LL is condensed by the lens can be adjusted to a predetermined position. For example, the condensing position of the light LL is converged in the translucent portion A11. With this, the light entering the wiring portion A12 of the wiring layer 20 can be reduced, and the light entering the translucent portion A11 can be increased. As a constituent material of the optical path adjusting layer 24, for example, an inorganic compound silicone is exemplified, and it is preferred that oxide silicone be contained.

It is preferred that the thickness of the optical path adjusting layer 24 be from 2 μm to 30 μm, more preferably, 3 μm to 15 μm, and further preferably, 5 μm to 10 μm. When the thickness of the optical path adjusting layer 24 falls within the above-mentioned range, the optical path length can easily be secured, and the condensing position of the light LL can easily be positioned in, for example, the translucent portion A11. Thus, the light LL entering the wiring portion A12 of the wiring layer 20 is easily reduced, and at the same time, particularly the light LL entering the translucent portion A11 can easily be increased. Note that, when the optical path adjusting layer 24 is adopted to a microlens used in a general active matrix type liquid crystal display device, the light LL entering the translucent portion A11 can be increased as described above by setting the thickness of the optical path adjusting layer 24 within the above-mentioned range.

Here, as described above, the first recessed portion 211 is provided to the base plate 21, and hence the condensing position of the light LL can be positioned in, for example, the translucent portion A11 without excessively increasing the thickness of the optical path adjusting layer 24, as compared to a case where the first recessed portion 211 is not provided. Because the thickness of the optical path adjusting layer 24 is not excessively increased, the entire thickness of the element substrate 1 can be prevented from being excessively increased. Thus, the element substrate 1 can be reduced in height.

Note that, the thickness of the optical path adjusting layer 24 is not limited to be set so as to position the condensing position of the light LL in the translucent portion A11, and may be set so that the condensing position is adjusted to a predetermined position outside the translucent portion A11.

Wiring Layer 20

The wiring layer 20 includes light shielding films 260, the scanning lines 261, the capacitance lines 263, the TFTs 26, the signal lines 262, and an insulator 25. The scanning lines 261, the capacitance lines 263, and the signal lines 262 correspond to "wirings". The light shielding films 260, the scanning lines 261, the capacitance lines 263, the TFTs 26, and the signal lines 262 are aligned in the stated order from the optical path adjusting layer 24 to the alignment film 29. Note that, the alignment order of the light shielding films 260, the scanning lines 261, the capacitance lines 263, the TFTs 26, and the signal lines 262, which is illustrated in FIG. 4, is merely an example, and the alignment order of those elements is not limited to the illustrated example. As described above, the signal lines 262 extend in the x direction. However, in FIG. 4, the arrangement of the signal lines 262 is different from the actual arrangement for easy understanding.

The insulator 25 includes a first interlayer insulating film 251, a second interlayer insulating film 252, a third interlayer insulating film 253, a fourth interlayer insulating film 254, and a fifth interlayer insulating film 255. The first interlayer insulating film 251 is arranged on the optical path adjusting layer 24, and is positioned between the light shielding films 260 and the scanning lines 261. The second interlayer insulating film 252 is arranged on the first interlayer insulating film 251, and is positioned between the scanning lines 261 and the capacitance lines 263. The third interlayer insulating film 253 is arranged on the second interlayer insulating film 252, and is positioned between the capacitance lines 263 and the TFTs 26. The fourth interlayer insulating film 254 is arranged on the third interlayer insulating film 253, and is positioned between the TFTs 26 and the signal lines 262. The fifth interlayer insulating film 255 is arranged on the fourth interlayer insulating film 254, and covers the signal lines 262.

A light shielding film 269 overlapping with the first recessed portion 211 in plan view is arranged on the optical path adjusting layer 24. Note that, the light shielding film 269 does not overlap the second lens surfaces 212 in plan view. The light shielding film 269 blocks the light LL that does not pass through the second lens surfaces 212. By blocking the light, stray light in the wiring layer 20 can be reduced or prevented. The light shielding film 269 overlaps the TFTs 26 in plan view, and suppresses or prevents the light LL from entering the TFTs 26. Note that, the light shielding films 260 and the light shielding film 269 may be omitted.

As a material for each layer forming the insulator 25, for example, an inorganic compound silicone is exemplified, and it is preferred that oxide silicone be contained. Note that, the layers forming the insulator 25 may be formed of the same material, or may be formed of materials different from one another. As a constituent element for the light shielding films 260, the light shielding film 269, for example, the scanning lines 261, the capacitance lines 263, the TFTs 26, and the signal lines 262, a metal material such as metal, metal silicide, and a metal compound is exemplified. The light shielding films 260, the light shielding film 269, the scanning lines 261, the capacitance lines 263, the TFTs 26, and the signal lines 262 may be formed of the same constituent material, or may be formed of constituent materials different from one another.

Here, in the display region A10, the wiring layer 20 includes the plurality of translucent portions A11 having translucency and the wiring portions A12 that block light. The translucent portions A11 are regions of the wiring layer 20 through which light passes in plan view. The wiring portions A12 are regions, which include the light shielding films 260, the TFTs 26, the scanning lines 261, the signal lines 262, and the capacitance lines 263 in plan view, and are positioned in the peripheries of the translucent portions A11. As described above, the scanning lines 261 and the signal lines 262 cross with each other, and form a lattice-like pattern in plan view. Thus, although not illustrated in detail, the wiring portions A12 form a lattice-like pattern in plan view. Meanwhile, the plurality of translucent portions A11 are arrayed in a matrix in plan view. The translucent portion A11 is arranged for each of the second lens surfaces 212.

Second Insulating Layer 31

The second insulating layer 31 has translucency and an insulating property. The second insulating layer 31 is contact with the surface of the wiring layer 20 on the +z axis side, an is arranged on the wiring layer 20. In other words, the second insulating layer 31 is arranged between the wiring layer 20 and the insulating layer 32 described later. By providing the second insulating layer 31, for example, the various wirings of the wiring layer 20 can easily be guided.

Insulating Layer 32 the insulating layer 32 is in contact with the surface of the second insulating layer 31 on the +z axis side, and is arranged on the second insulating layer 31. In other words, the insulating layer 32 is arranged between the wiring layer 20 and the pixel electrodes 28. The insulating layer 32 has translucency and an insulating property. As the insulating layer 32, for example, an inorganic compound containing silicone is exemplified, and it is preferred that oxide silicone be contained. The plurality of lens surfaces 321 having a concave surface shape are provided in the surface of the insulating layer 32 on the +z axis side. The plurality of lens surfaces 321 are arranged in a matrix in plan view, and overlap the plurality of translucent portions A11 in plan view. A pair formed of one translucent portion A11 and the lens surfaces 321 is arranged. Note that, the lens surfaces 321 may have a convex surface shape.

Lens Layer 33

The lens layer 33 is arranged between the insulating layer 32 and the pixel electrodes 28, is contact with the lens surfaces 321, and is arranged on the insulating layer 32. The lens layer 33 has translucency and an insulating property. A refractive factor of the lens layer 33 is different from a refractive factor of the insulating layer 32, and the lens surfaces 321 and the lens layer 33 form a lens. In the present exemplary embodiment, a refractive factor of the lens layer 33 is larger than the refractive factor of the insulating layer 32. The lens returns the light having been converged by passing through the second lens surfaces 212 to parallel light. The constituent material of the lens layer 33 is, for example, silicone oxide nitride.

First Protective Layer 34

The first protective layer 34 has translucency and an insulating property. The first protective layer 34 is contact with the surface of the lens layer 33 on the +z axis side, and is arranged on the lens layer 33. By arranging the first protective layer 34 on the lens layer 33, a crack and the like caused in the second lens layer 22 can be suppressed at the time of manufacturing the element substrate 1. As compared to a case where the first protective layer 34 is not provided, flatness of the surfaces of the pixel electrodes 28 can be improved. As a constituent material of the first protective layer 34, for example, an inorganic compound containing silicone is exemplified, and it is preferred that oxide silicone be contained. Glass such as borosilicate glass (BSG) may be used for the first protective layer 34 form a viewpoint of improving adhesiveness with respect to the pixel electrodes 28.

Pixel Electrode 28

The plurality of pixel electrodes 28 are contact with the surface of the first protective layer 34 on the +z axis side, and are arranged on the first protective layer 34. The plurality of pixel electrodes 28 overlap the translucent portions A11 in plan view, and are arranged in a matrix. A pair formed of one lens surface 321 and one pixel electrode 28 is arranged. Note that, the alignment film 29 is arranged on the plurality of pixel electrodes 28.

The plurality of pixel electrodes 28 are electrically coupled to the drains of the TFTs 26 being an example of "parts of the wirings" through intermediation of a plurality of through electrodes 35 passing through the insulating layer 32 and the lens layer 33. One pixel electrode 28 is electrically coupled to one signal line 262 through intermediation of one through electrode 35. Note that, the through electrode 35 contains, for example, a metal material. With the through electrodes 35, the pixel electrodes 28 and the wiring layer 20 can be coupled easily.

1-1d. Configurations of First Position Adjusting Portion 6 and Second Position Adjusting Portion 5

As illustrated in FIG. 4, the element substrate 1 includes the second position adjusting portion 5 and the first position adjusting portion 6. The second position adjusting portion 5 is used for adjusting a relative positional relationship between the second lens surfaces 212 and the translucent portions A11 in plan view. The first position adjusting portion 6 is used for adjusting a relative positional relationship between the translucent portions A11 and the lens surfaces 321 in plan view.

The second position adjusting portion 5 includes the first protruding portion 51, a second protruding portion 52, a third protruding portion 53, and a fourth protruding portion 54. The first position adjusting portion 6 includes a fifth protruding portion 61, a sixth protruding portion 62, a seventh protruding portion 63, an eighth protruding portion 64, and a ninth protruding portion 65. Those protruding portions are alignment marks for adjusting a relative positional relationship of two or more target portions. In the present exemplary embodiment, a planer shape of each of those protruding portions is rectangular. Note that, the planer shape is not limited to a rectangular shape, but freely selected. For example, a circular shape, a polygonal shape other than a rectangular shape, and the like may be adopted.

The fifth protruding portion 61 is an example of a "first mark", the sixth protruding portion 62 is an example of a "third mark", and the eighth protruding portion 64 is an example of a "second mark". The first protruding portion 51 is an example of a "fourth mark", and the fourth protruding portion 54 is an example of a "fifth mark".

First Protruding Portion 51

The first protruding portion 51 is contact with the base plate 21, is arranged between the base plate 21 and the second protective layer 23, and protrudes from the base plate 21 to the second protective layer 23. In the present exemplary embodiment, the first protruding portion 51 is arranged in the second recessed portion 213 of the base plate 21. Light transmittance of the first protruding portion 51 is lower than light transmittance of the base plate 21. The first protruding portion 51 contains, for example, silicone or silicone oxide nitride. Note that, the first protruding portion 51 may be formed of, for example, various metal materials.

Second Protruding Portion 52

The second protruding portion 52 is contact with the second protective layer 23, is arranged between the second protective layer 23 and the optical path adjusting layer 24, and protrudes from the second protective layer 23 to the optical path adjusting layer 24. Light transmittance of the second protruding portion 52 is lower than light transmittance of the second protective layer 23. The second protruding portion 52 contains, for example, silicone or silicone oxide nitride.

Figure 5:
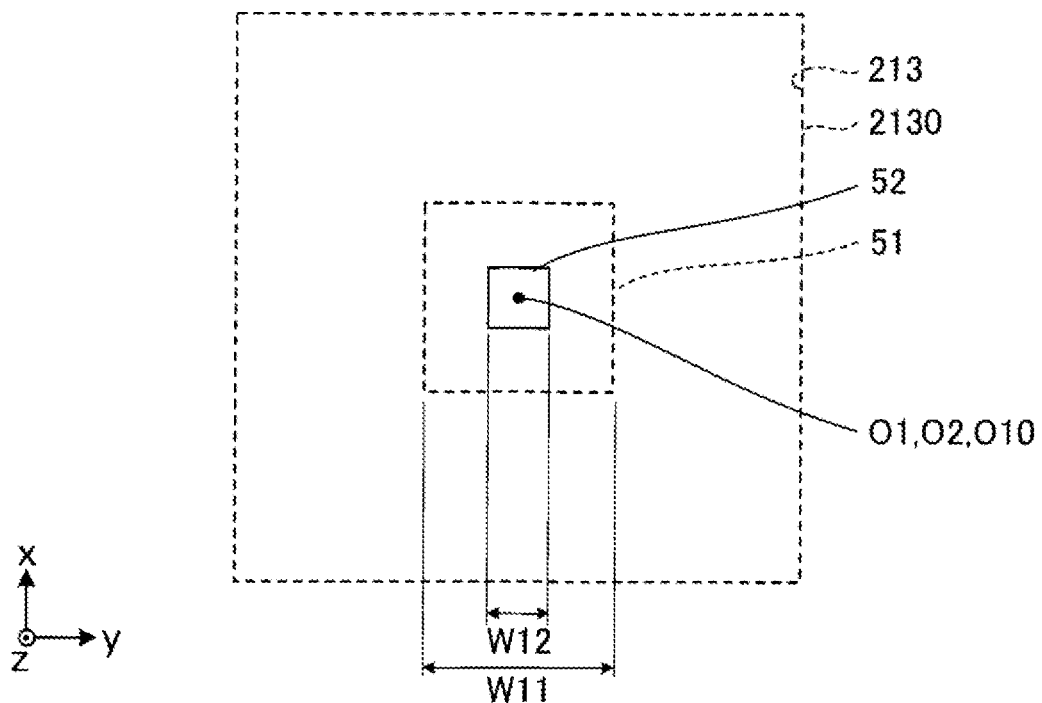
FIG. 5 is a diagram illustrating arrangement of a second recessed portion, a first protruding portion, and a second protruding portion in the first exemplary embodiment.

FIG. 5 is a diagram illustrating arrangement of the second recessed portion 213, the first protruding portion 51, and the second protruding portion 52 in the first exemplary embodiment. As illustrated in FIG. 5, the second protruding portion 52 overlap the first protruding portion 51 in plan view. A plane area of the second protruding portion 52 is smaller than a plane area of the first protruding portion 51. In the illustrated example, a width W12 of the second protruding portion 52 in the y direction is smaller than a width W11 of the first protruding portion 51 in they direction. A geometrical center O2 of the second protruding portion 52 in plan view matches with a geometrical center O1 of the first protruding portion 51 in plan view. In the present exemplary embodiment, an opening edge 2130 of the second recessed portion 213 has a rectangular shape in plan view, and the geometrical center O1 matches with a geometrical center O10 of a region surrounded by the opening edge 2130 in plan view. Here, the term "match" refers not only to a state of complete match but also to a state in which a distance between the centers falls within a range of 1 μm or smaller. In the present exemplary embodiment, the plane shape of the region surrounded by the opening edge 2130, the plane shape of the first protruding portion 51, and the plane shape of the second protruding portion 52 are substantially analogous, and have sides substantially parallel to each other.

Third Protruding Portion 53

As illustrated in FIG. 4, the third protruding portion 53 is contact with the second protective layer 23, is arranged between the second protective layer 23 and the optical path adjusting layer 24, and protrudes from the second protective layer 23 to the optical path adjusting layer 24. The third protruding portion 53 is arranged so as to be flush with the second protruding portion 52, and is positioned in the vicinity of the second protruding portion 52 while being away from the second protruding portion 52. A plane area of the third protruding portion 53 is larger than a plane area of the second protruding portion 52. In the illustrated example, the width W12 of the second protruding portion 52 is smaller than a width W13 of the third protruding portion 53 in the y direction. In the present exemplary embodiment, light transmittance of the third protruding portion 53 is equal to that of the second protruding portion 52, and the constituent material of the third protruding portion 53 is the same as that of the second protruding portion 52. Note that, the light transmittance and the constituent material of the third protruding portion 53 may be different from those of the second protruding portion 52. The light transmittance of the second protruding portion 52 and the light transmittance of the third protruding portion 53 describe above may be equal to or higher than the light transmittance of the second protective layer 23.

Here, the surface of the optical path adjusting layer 24 on the +z axis side includes a first part 241 overlapping the second protruding portion 52 in plan view and a second part 242 overlapping the third protruding portion 53. The first part 241 and the second part 242 protrude to the wiring layer 20 with respect to the parts of the surface of the optical path adjusting layer 24 on the +z axis, which are other than the first part 241 and the second part 242. The first part 241 has a shape in conformity with the shape of the second protruding portion 52, and the second part 242 has a shape in conformity with the third protruding portion 53. That is, the first part 241 in which a film thickness of the second protruding portion 52 is reflected is formed into a plane shape similar to that of the second protruding portion 52, and the second part 242 in which a film thickness of the third protruding portion 53 is formed into a plane shape similar to that of the third protruding portion 53. Thus, a plane area of the second part 242 is larger than a plane area of the first part 241. In the illustrated example, a width W22 of the second part 242 in the y direction is larger than a width W21 of the first part 241 in the y direction.

Fourth Protruding Portion 54

The fourth protruding portion 54 is contact with the optical path adjusting layer 24, is arranged between the optical path adjusting layer 24 and the wiring layer 20, and protrudes from the optical path adjusting layer 24 to the wiring layer 20. The fourth protruding portion 54 is arranged on the second part 242 of the optical path adjusting layer 24. Light transmittance of the fourth protruding portion 54 is lower than light transmittance of the optical path adjusting layer 24. The fourth protruding portion 54 contains, for example, a metal material. In the present exemplary embodiment, the constituent material of the fourth protruding portion 54 may be the same as the constituent material of the light shielding films 260.

Figure 6:
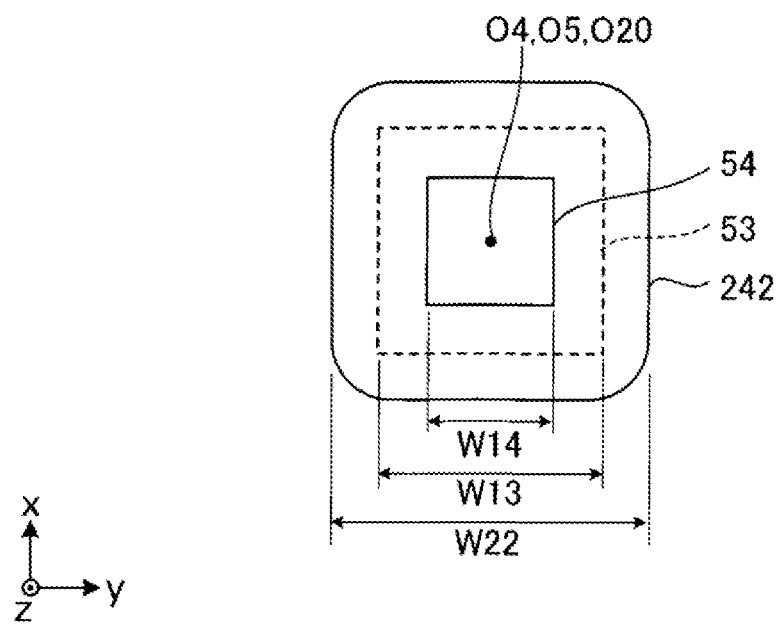
FIG. 6 is a diagram illustrating arrangement of a third protruding portion, a second portion, and a fourth protruding portion in the first exemplary embodiment.

FIG. 6 is a diagram illustrating arrangement of the third protruding portion 53, the second part 242, and the fourth protruding portion 54 in the first exemplary embodiment. As illustrated in FIG. 6, the fourth protruding portion 54 overlap the second part 242 in plan view. A plane area of the fourth protruding portion 54 is smaller than a plane area of the second part 242. In the illustrated example, a width W14 of the fourth protruding portion 54 in the y direction is smaller than the width W22 of the second part 242. A geometrical center of O4 of the fourth protruding portion 54 in plan view matches with a geometrical center O20 of the second part 242 in plan view. Note that, the fourth protruding portion 54 overlaps the second part 242 in plan view, and hence also overlaps the third protruding portion 53 in plan view. The geometrical center O4 of the fourth protruding portion 54 in plan view matches with a geometrical center O3 of the third protruding portion 53 in plan view. Here, the term "match" refers not only to a state of complete match but also to a state in which a distance between the centers falls within a range of 1 µm or smaller. In the present exemplary embodiment, the plane shape of the third protruding portion 53, the plane shape of the second part 242, and the plane shape the second protruding portion 52 are substantially analogous, and have sides substantially parallel to each other.

Fifth Protruding Portion 61

The fifth protruding portion 61 is contact with the fourth interlayer insulating film 254, and is arranged between the fourth interlayer insulating film 254 and the fifth interlayer insulating film 255. As described above, the signal lines 262 are formed on the fourth interlayer insulating film 254, and hence the fifth protruding portion 61 and the signal lines 262 being "parts of the wiring" are formed on the same layer. In the present exemplary embodiment, the fourth interlayer insulating film 254 corresponds to an "insulating film". The fifth protruding portion 61 protrudes from the fourth interlayer insulating film 254 to the insulating layer 32. Light transmittance of the fifth protruding portion 61 is lower than light transmittance of the fourth interlayer insulating film 254. A constituent material of the fifth protruding portion 61 is the same as that of the signal lines 262, that is, for example, a metal material. Note that, the constituent material of the fifth protruding portion 61 may be different from that of the signal lines 262. For example, the fifth protruding portion 61 may contain silicone or silicone oxide nitride. The fifth protruding portion 61 may be formed on the third interlayer insulating film 253. In this case, the third interlayer insulating film 253 corresponds to an "insulating film".

Sixth Protruding Portion 62

The sixth protruding portion 62 is contact with the second insulating layer 31, is arranged between the second insulating layer 31 and the insulating layer 32, and protrudes from the second insulating layer 31 to the insulating layer 32. Light transmittance of the sixth protruding portion 62 is lower than light transmittance of the second insulating layer 31. Note that, the sixth protruding portion 62 contains, for example, silicone, silicone oxide nitride, and a transparent conductive material such as ITO.

Figure 7:
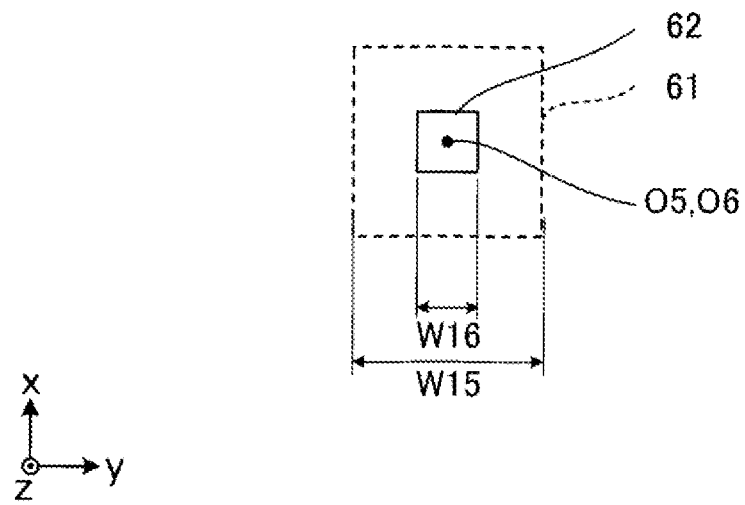
FIG. 7 is a diagram illustrating arrangement of a fifth protruding portion and a sixth protruding portion in the first exemplary embodiment.

FIG. 7 is a diagram illustrating arrangement of the fifth protruding portion 61 and the sixth protruding portion 62 in the first exemplary embodiment. As illustrated in FIG. 7, the sixth protruding portion 62 overlaps the fifth protruding portion 61 in plan view. A plane area of the sixth protruding portion 62 is smaller than a plane area of the fifth protruding portion 61. In the illustrated example, a width W16 of the sixth protruding portion 62 in the y direction is smaller than a width W15 of the fifth protruding portion 61 in the y direction. A geometrical center O6 of the sixth protruding portion 62 in plan view matches with a geometrical center O5 of the fifth protruding portion 61 in plan view. Here, the term "match" refers not only to a state of complete match but also to a state in which a distance between the centers falls within a range of 1 µm or smaller. In the present exemplary embodiment, the plane shape of the fifth protruding portion 61 and the plane shape of the sixth protruding portion 62 are substantially analogous, and have sides substantially parallel to each other.

Seventh Protruding Portion 63

The seventh protruding portion 63 is contact with the second insulating layer 31, is arranged between the second insulating layer 31 and the insulating layer 32, and protrudes from the second insulating layer 31 to the insulating layer 32. The seventh protruding portion 63 is arranged so as to be flush with the sixth protruding portion 62, and is positioned in the vicinity of the sixth protruding portion 62 while being away from the sixth protruding portion 62. A plane area of the seventh protruding portion 63 is larger than a plane area of the sixth protruding portion 62. In the illustrated example, a width W17 of the seventh protruding portion 63 is smaller than the width W16 of the sixth protruding portion 62 in the y direction. In the present exemplary embodiment, light transmittance of the seventh protruding portion 63 is equal to that of the sixth protruding portion 62, and a constituent material of the seventh protruding portion 63 is the same as that of the sixth protruding portion 62. Note that, the light transmittance and the constituent material of the seventh protruding portion 63 may be different from those of the sixth protruding portion 62. The light transmittance of the sixth protruding portion 62 and the light transmittance of the seventh protruding portion 63 described above may be equal to or higher than the light transmittance of the second protective layer 23. The sixth protruding portion 62 and the seventh protruding portion 63 may be formed of, for example, a transparent conductive material such as ITO.

Here, the surface of the insulating layer 32 on the +z axis side includes a third part 322 overlapping with the sixth protruding portion 62 in plan view and a fourth part 323 overlapping with the seventh protruding portion 63 in plan view. The third part 322 and the fourth part 323 protrude to the first protective layer 34 with respect to the parts of the insulating layer 32 on the +z axis side, which are other than the third part 322 and the fourth part 323. The third part 322 has a shape in conformity with the shape of the sixth protruding portion 62, and the fourth part 323 has a shape in conformity with the shape of the seventh protruding portion 63. That is, the third part 322 in which a film thickness of the sixth protruding portion 62 is reflected is formed into a plane shape similar to that of the sixth protruding portion 62, and the fourth part 323 in which a film thickness of the seventh protruding portion 63 is reflected is formed into a plane shape similar to that of the seventh protruding portion 63. Thus, a plane area of the fourth part 323 is larger than a plane area of the third part 322. In the illustrated example, a width W24 of the fourth part 323 in the y direction is larger than a width W23 of the third part 322 in the y direction.

Eighth Protruding Portion 64

The eighth protruding portion 64 is contact with the insulating layer 32, is arranged between the insulating layer 32 and the first protective layer 34, and protrudes from the insulating layer 32 to the first protective layer 34. The eighth protruding portion 64 is arranged on the fourth part 323 of the insulating layer 32. Light transmittance of the eighth protruding portion 64 is lower than light transmittance of the insulating layer 32. The eighth protruding portion 64 contains, for example, silicone or silicone oxide nitride.

Figure 8:
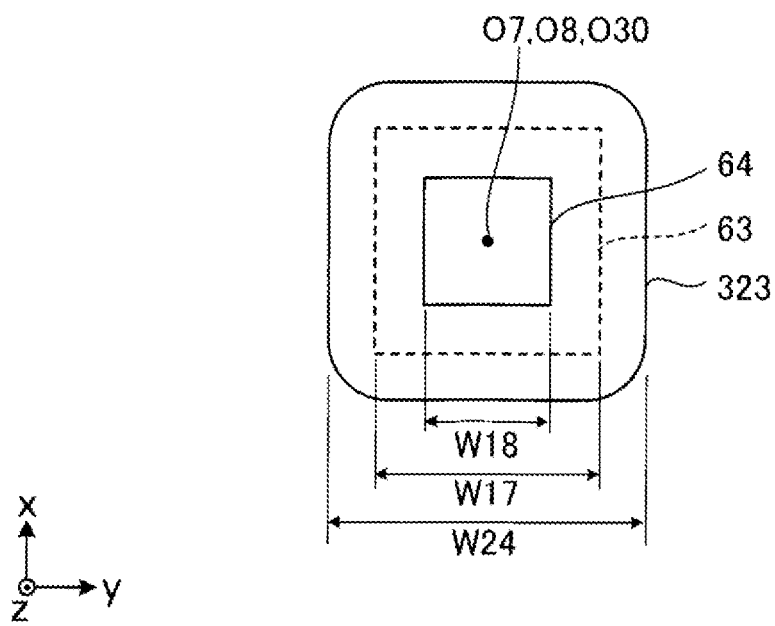
FIG. 8 is a diagram illustrating arrangement of a seventh protruding portion, a fourth portion, and an eighth protruding portion in the first exemplary embodiment.

FIG. 8 is a diagram illustrating arrangement of the seventh protruding portion 63, the fourth part 323 the eighth protruding portion 64 in the first exemplary embodiment. As illustrated in FIG. 8, the seventh protruding portion 63 overlaps the fourth part 323 in plan view. A plane area of the eighth protruding portion 64 is smaller than a plane area of the fourth part 323. In the illustrated example, a width W18 of the eighth protruding portion 64 in the y direction is smaller than the width W24 of the fourth part 323. A geometrical center O8 of the eighth protruding portion 64 in plan view matches with a geometrical center O30 of the fourth part 323 in plan view. Note that, the eighth protruding portion 64 overlaps the fourth part 323 in plan view, and hence also overlaps the seventh protruding portion 63 in plan view. The geometrical center O8 of the eighth protruding portion 64 in plan view matches with a geometrical center O3 of the seventh protruding portion 63 in plan view. Here, the term "match" refers not only to a state of complete match but also to a state in which a distance between the centers falls within a range of 1 μm or smaller. In the present exemplary embodiment, the plane shape of the seventh protruding portion 63, the plane shape of the fourth part 323, and the plane shape of the eighth protruding portion 64 are substantially analogous, and have sides substantially parallel to each other.

Ninth Protruding Portion 65

The ninth protruding portion 65 is contact with the insulating layer 32, is arranged between the insulating layer 32 and the first protective layer 34, and protrudes from the insulating layer 32 to the first protective layer 34. The ninth protruding portion 65 is positioned in the vicinity of the eighth protruding portion 64 while being away from the eighth protruding portion 64. A plane area of the ninth protruding portion 65 is larger than a plane area of the eighth protruding portion 64. In the illustrated example, a width W19 of the ninth protruding portion 65 in the y direction is larger than the width W18 of the eighth protruding portion 64 in the y direction. In the present exemplary embodiment, light transmittance of the ninth protruding portion 65 is equal to that of the eighth protruding portion 64, and a constituent material of the ninth protruding portion 65 is the same as that of the eighth protruding portion 64, that is, for example, silicone or silicone oxide nitride. Note that, the light transmittance and the constituent material of the ninth protruding portion 65 may be different from those of the eighth protruding portion 64. The light transmittance of the ninth protruding portion 65 and the light transmittance of the eighth protruding portion 64 described above may be equal to or higher than the light transmittance of the insulating layer 32.

As described above, the element substrate 1 includes the wiring layer 20 including the translucent portions A11 and the wiring portions A12, the insulating layer 32 including the lens surfaces 321, the lens layer 33, the pixel electrodes 28, the fifth protruding portion 61, and the eighth protruding portion 64. Further, the fifth protruding portion 61 is formed of the same layer as the signal lines 262. The eighth protruding portion 64 is contact with the insulating layer 32, and is arranged on the lens layer 33 side as viewed from the insulating layer 32.

The fifth protruding portion 61 and the signal lines 262 are formed of the same layer. Thus, at the time of manufacturing those components, the fifth protruding portion 61 is formed with the signal lines 262 as a reference, a positional difference of the fifth protruding portion 61 with respect to the position of the signal lines 262 is sufficiently reduced. Further, a positional difference of the fifth protruding portion 61 with respect to the translucent portions A11 is sufficiently reduced. The eighth protruding portion 64 is arranged on the surface of the insulating layer 32 on the lens layer 33 side. Thus, at the time of manufacturing the element substrate 1, by forming the lens surfaces 321 with the eighth protruding portion 64 as a reference, the positional difference of the lens surfaces 321 with respect to the eighth protruding portion 64 is sufficiently reduced. As a result, the translucent portions A11 and the lens surfaces 321 can be positioned relatively in plan view at high accuracy. Thus, relative positional shift between the second lens surfaces 212 and the translucent portions A11 in plan view can be reduced. Along with this, relative positional shift among the second lens surfaces 212, the translucent portions A11, and the pixel electrodes 28 in plan view can be reduced. Therefore, the light entering the pixel electrodes 28 can be increased, and hence efficiency in utilizing the light in the element substrate 1 can be improved.

As described above, the light transmittance of the fifth protruding portion 61 is lower than the light transmittance of the fourth interlayer insulating film 254 corresponding to an "insulating film". The eighth protruding portion 64 has light transmittance lower than that of the insulating layer 32. By using the fifth protruding portion 61 and the eighth protruding portion 64 which have the above-mentioned light transmittance, a contour is easily grasped. Thus, for example, by using an optical microscope or the like, a relative position of the eighth protruding portion 64 with respect to the fifth protruding portion 61 in plan view can be determined through use of light transmittance. Note that, the above-mentioned position adjusting may be performed through use of a difference of the light transmittance relating to a wavelength region of light other than visible light.

As described above, the constituent material of the fifth protruding portion 61 is the same as that of the signal lines 262, and contains a metal material such as metal, metal silicide, and a metal compound. Thus, the signal lines 262 and the fifth protruding portion 61 can be formed collectively, and hence the relative position of the fifth protruding portion 61 with respect to the translucent portions A11 and the wiring portions A12 in plan view can be determined easily at high accuracy as compared to a case where those components are not formed collectively. Note that, it is preferred that the fifth protruding portion 61 be formed of only a metal material, but other materials may be contained.

The eighth protruding portion 64 contains, for example, silicone or silicone oxide nitride. By containing this material, the eighth protruding portion 64 having a target shape and size can be formed easily at high accuracy as compared to a case where other materials are contained. The eighth protruding portion 64 containing the material is preferred because of adhesiveness with the insulating layer 32 formed of, for example, an inorganic compound containing silicone. Note that, it is preferred that the eighth protruding portion 64 be formed of only one or both of silicone and silicone oxide nitride. However, for example, other materials may be contained at a content rate lower than a content rate of silicone or silicone oxide nitride. The eighth protruding portion 64 may be formed of a material other than the material, such as a metal material.

As described above, the fifth protruding portion 61 protrudes from the fourth interlayer insulating film 254 to the insulating layer 32, the eighth protruding portion 64 protrudes from the insulating layer 32 to the lens layer 33. With such configuration, a contour of the fifth protruding portion 61 and a contour of the eighth protruding portion 64 in plan view can be grasped clearly. Thus, positioning through use of the fifth protruding portion 61 and the eighth protruding portion 58 can be performed easily at high accuracy.

Note that, in the present exemplary embodiment, the "first mark" corresponds to the fifth protruding portion 61. However, the "first mark" may be formed of, for example, a film containing a color material or a fluorescence material, which is arranged on the fourth interlayer insulating film 254. In this case, for example, a groove or the like is provided in the fourth interlayer insulating film 254, and the film is applied to the groove. In this manner, the "first mark" may be formed. Note that, the "second mark" may be similarly configured.

As described above, the element substrate 1 includes the second insulating layer 31 and the sixth protruding portion 62, which is contact with the second insulating layer 31, and is arranged on the insulating layer 32 side as viewed from the second insulating layer 31. By providing the sixth protruding portion 62, relative positional shift between the translucent portions A11 and the lens surfaces 321 in plan view can be reduced even in the element substrate 1 including the second insulating layer 31. Specifically, by setting a relative positional relationship between the fifth protruding portion 61 and the sixth protruding portion 62 in plan view, a relative positional relationship between the sixth protruding portion 62 and the translucent portions A11 in plan view is determined. By setting a relative positional relationship between the seventh protruding portion 63 and the eighth protruding portion 64 in plan view, a relative positional relationship between the seventh protruding portion 63 and the lens surfaces 321 in plan view is determined. Thus, relative positional shift between the translucent portions A11 and the lens surfaces 321 in plan view can be reduced.

Further, in the present exemplary embodiment, the sixth protruding portion 62 overlaps the fifth protruding portion 61 in plan view. Thus, as compared to a case where those components do not overlap each other in plan view, the relative position of the sixth protruding portion 62 with respect to the fifth protruding portion 61 in plan view can be determined easily at high accuracy.

Note that, the second insulating layer 31 may be omitted. In a case where the second insulating layer 31 is omitted, the insulating layer 32 is arranged so as to be contact with the wiring layer 20. In this case, the sixth protruding portion 62 and the seventh protruding portion 63 may be omitted. In a case where the second insulating layer 31, the sixth protruding portion 62, and the seventh protruding portion 63 are omitted, it is preferred that the fifth protruding portion 61 and the eighth protruding portion 64 overlap each other in plan view. As compared to a case where those components do not overlap each other, the relative position of the eighth protruding portion 64 with respect to the fifth protruding portion 61 in plan view can be determined easily at high accuracy.

As described above, the element substrate 1 includes the base plate 21 including the second lens surfaces 212, the second lens layer 22, the optical path adjusting layer 24, the first protruding portion 51, and the fourth protruding portion 54. The first protruding portion 51 is arranged so as to be contact with the base plate 21. Thus, at the time of manufacturing the element substrate 1, by forming the second lens surfaces 212 with the first protruding portion 51 as a reference, a positional difference between the first protruding portion 51 and the second lens surfaces 212 in plan view can sufficiently be reduced. The wiring layer 20 is arranged so as to be contact with the optical path adjusting layer 24, and similarly, the fourth protruding portion 54 is arranged so as to be contact with the optical path adjusting layer 24. Thus, at the time of manufacturing the element substrate 1, by forming the light shielding films 260 with the fourth protruding portion 54 as a reference, a positional difference between the fourth protruding portion 54 and the translucent portions A11 in plan view can sufficiently be reduced. Therefore, the relative positioning between the second lens surfaces 212 and the translucent portions A11 in plan view can be performed at high accuracy. Thus, relative positional shift between the second lens surfaces 212 and the translucent portions A11 in plan view can be reduced.

Further, in the present exemplary embodiment, the second protruding portion 52 overlaps the first protruding portion 51 in plan view. Thus, as compare to a case where those components do not overlap each other in plan view, the relative position of the second protruding portion 52 with respect to the first protruding portion 51 in plan view can be determined easily at high accuracy. Note that, the second protective layer 23 may be omitted. In a case where the second protective layer 23 is omitted, the optical path adjusting layer 24 is arranged so as to be contact with the base plate 21. In this case, the second protruding portion 52 and the third protruding portion 53 may be omitted. In a case where the second protective layer 23, the second protruding portion 52, and the third protruding portion 53 are omitted, it is preferred that the first protruding portion 51 and the fourth protruding portion 54 overlap each other in plan view. As compared to a case where those components do not overlap each other, the relative positions of the first protruding portion 51 and the fourth protruding portion 54 in plan view can be determined easily at high accuracy.

With the second position adjusting portion 5 and the first position adjusting portion 6 described above, even when the lens surfaces 321 and the second lens surfaces 212 are arranged so as to sandwich the wiring layer 20 therebetween, the positional shift among the second lens surfaces 212, the translucent portions A11, and the lens surfaces 321 in plan view can be reduced. Through use of the second position adjusting portion 5, the relative positional relationship between the plurality of second lens surfaces 212 and the plurality of translucent portions A11 in plan view is adjusted. Through use of the first position adjusting portion 6, the relative positional relationship among the plurality of translucent portions A11, the plurality of lens surfaces 321, and the plurality of pixel electrodes 28 in plan view is adjusted. In this manner, the positional shift among the plurality of second lens surfaces 212, the plurality of translucent portions A11, the plurality of lens surfaces 321, and the plurality of pixel electrodes 28 in plan view can be reduced.

1-1e. Method of Manufacturing Electro-Optical Device 100

Figure 9:
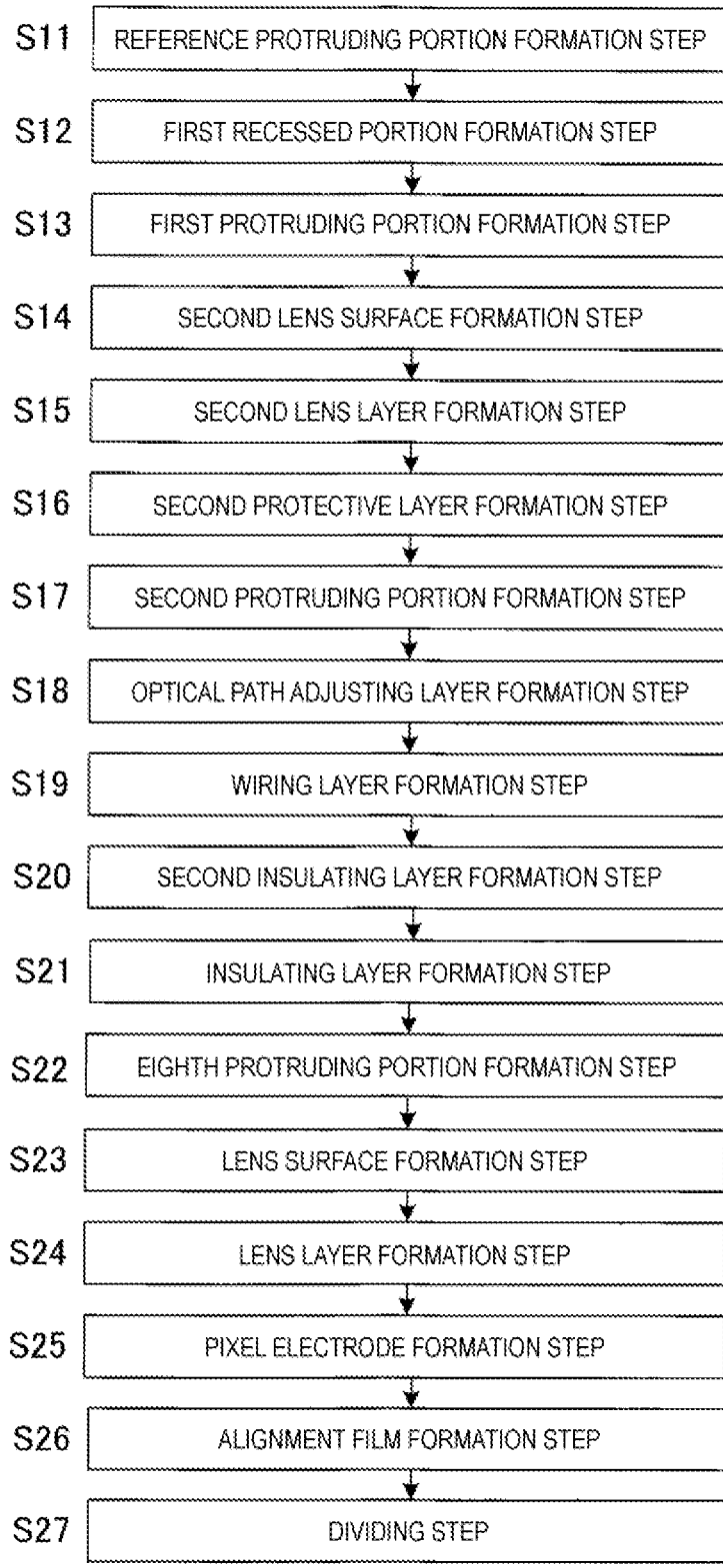
FIG. 9 is a flowchart illustrating a method of manufacturing the element substrate in the first exemplary embodiment.

Next, a method of manufacturing the electro-optical device 100 is described. First, a method of manufacturing the element substrate 1 included in the electro-optical device 100 is described. FIG. 9 is a flowchart illustrating a method of manufacturing the element substrate in the first exemplary embodiment. The method of manufacturing the element substrate 1 includes a reference protruding portion formation step S11, a first recessed portion formation step S12, a first protruding portion formation step S13, a second lens surface formation step S14, a second lens layer formation step S15, a second protective layer formation step S16, a second protruding portion formation step S17, an optical path adjusting layer formation step S18, and a wiring layer formation step S19. The method of manufacturing the element substrate 1 includes a second insulating layer formation step S20, an insulating layer formation step S21, an eighth protruding portion formation step S22, a lens surface formation step S23, a lens layer formation step S24, a pixel electrode formation step S25, an alignment film formation step S26, and a dividing step S27.

Figure 10:
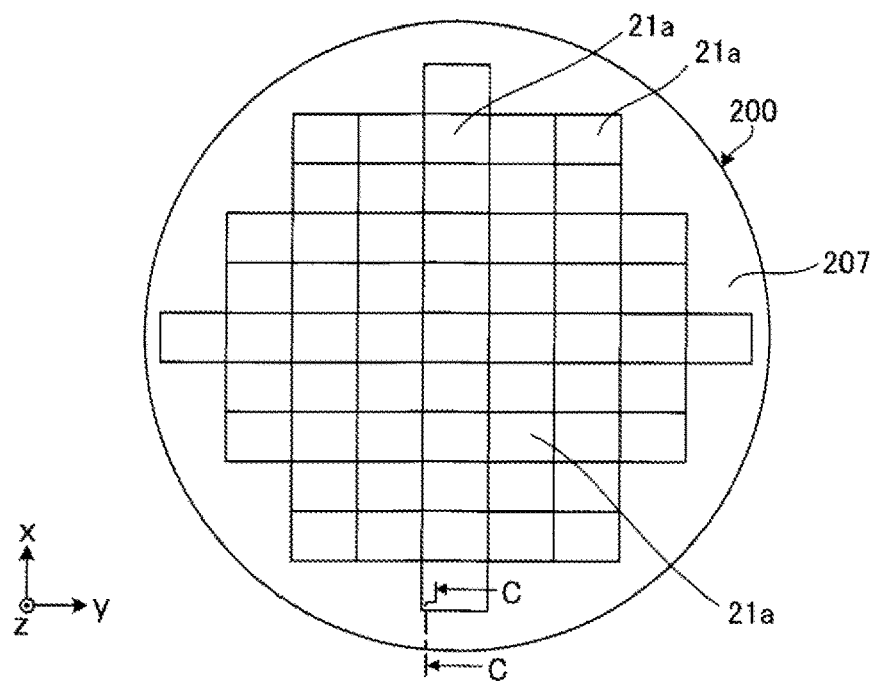
FIG. 10 is a plan view schematically illustrating a wafer used for manufacturing the element substrate in the first exemplary embodiment.

FIG. 10 is a plan view schematically illustrating a wafer 200 used for manufacturing the element substrate 1 in the first exemplary embodiment. The wafer 200 is an example of a "base material". The wafer 200 contains, for example, glass or quarts. A plurality of regions 21a is provided to the wafer 200. The wafer 200 is divided into the regions 21a in the dividing step S27, and is formed into the base plate 21 at the last stage. Note that, arrangement of the plurality of regions 21a is not limited to the illustrated example, and may be freely selected.

Now, with reference to FIG. 11 to FIG. 24, the steps are sequentially described. Note that, in each FIG. 11 to FIG. 24, a diagram corresponding to the cross-sectional view taken along the line C-C in FIG. 10 is given.

Reference Protruding Portion Formation Step S11

Figure 11:
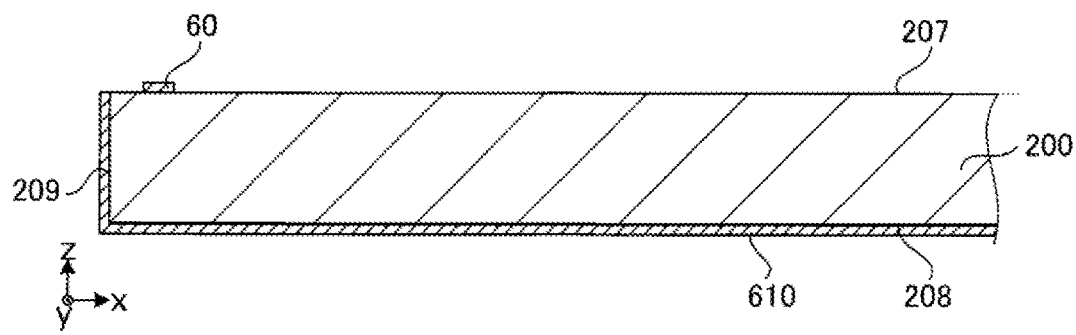
FIG. 11 is a cross-sectional view illustrating the substrate protruding portion formation step in the first exemplary embodiment.

FIG. 11 is a cross-sectional view illustrating the reference protruding portion formation step in the first exemplary embodiment. As illustrated in FIG. 11, the wafer 200 includes a first surface 207, a second surface 208, and a side surface 209 connecting those surfaces with each other. In the reference protruding portion formation step S11, a conductive layer 610 is formed on the second surface 208 and the side surface 209, and a reference protruding portion 60 is formed on the first surface 207.

Specifically, first, a silicone film is formed on the first surface 207, the second surface 208, and the side surface 209 by a vapor deposition method such as a chemical vapor deposition (CVD) method. Sequentially, the silicone film is flattened by a flattening treatment such as a chemical mechanical polishing (CMP) method. Then, a part of the silicone film is removed by dry etching such as reactive ion etching (RIE) with fluorine-based gas as a reaction gas through use of a resist mask. With this, the conductive layer 610 and the reference protruding portion 60 illustrated in FIG. 11 are formed. By forming the conductive layer 610, the wafer 200 can be fixed to a base plate in a dry etching device by electrostatic attraction. The reference protruding portion 60 is a reference for determining positions of the first recessed portion 211 and the second recessed portion 213 in the region 21a in the later steps.

In the present exemplary embodiment, the silicone film is used at the time of forming the conductive layer 610, and hence a Poisson ratio of the conductive layer 610 is larger than a Poison ratio of the wafer 200 formed of quarts or glass. Thus, the conductive layer 610 has a function of reinforcing the wafer 200. Therefore, by providing the conductive layer 610, deformation of the wafer 200, which may be caused by annealing in a later step, can be suppressed as compared to a case where the component is not provided. The thickness of the conductive layer 610 is not particularly limited, but may be set to, for example, a thickness of approximately 3500 Å.

Note that, the reference protruding portion 60 may be provided for each of the regions 21a, or may not be provided for each of the regions 21a. The reference protruding portion 60 may be provided outside of the regions 21a. However, it is preferred that two or more reference protruding portions 60 be provided. In the present exemplary embodiment, the second position adjusting portion 5 formed in a later step is provided for each of the regions 21a.

Note that, in the illustrated example, an angle formed between the first surface 207 and the side surface 209, and an angle formed between the second surface 208 and the side surface 209 are 90 degrees, but may be an acute angle or an obtuse angle. A connection portion between the first surface 207 and the side surface 209, and a connection portion between the second surface 208 and the side surface 209 may have a radius of curvature.

First Recessed Portion Formation Step S12

Figure 12:
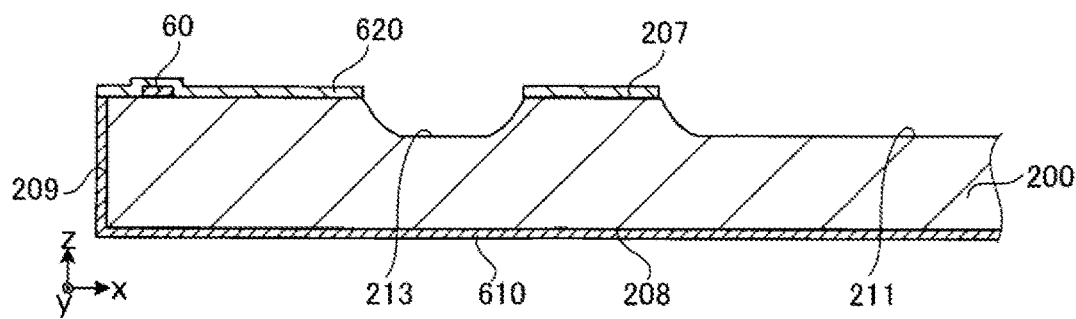
FIG. 12 is a cross-sectional view illustrating a first recessed portion formation step in the first exemplary embodiment.

FIG. 12 is a cross-sectional view illustrating the first recessed portion formation step in the first exemplary embodiment. In the first recessed portion formation step S12, first, a surface protective film 620 formed of, for example, a silicone oxide film, is formed on the first surface 207 by a vapor deposition method such as a plasma CVD method. After that, annealing is performed. Subsequently, a resist mask having a plurality of openings corresponding to the first recessed portion 211 and the second recessed portion 213 is formed, and a part of the surface protective film 620 and a part of the wafer 200 are removed by etching through use of the mask. With this, the first recessed portion 211 and the second recessed portion 213 illustrated in FIG. 12 are formed.

By performing the above-mentioned annealing, a residual stress of the wafer 200, which is generated in the processing in the former step is removed, thereby being capable of suppressing a warp of the wafer 200. By providing the surface protective film 620, a warp that may be caused in the wafer 200 by the annealing can be suppressed. For example, the above-mentioned etching is wet etching through use of etching liquid containing fluorine, for example. Note that, the etching may be dry etching.

When the resist mask described above is formed, a light exposure mask is arranged with the reference protruding portion 60 as a reference. With this, the plurality of openings corresponding to the first recessed portion 211 and the second recessed portion 213 are formed. By using the reference protruding portion 60 as a reference, the relative positional relationship of the first recessed portion 211 and the second recessed portion 213 with respect to the region 21a in plan view can be determined. Thus, for each of the regions 21a, the first recessed portion 211 and the second recessed portion 213 can be formed at target positions in the region 21a.

First Protruding Portion Formation Step S13

Figure 13:
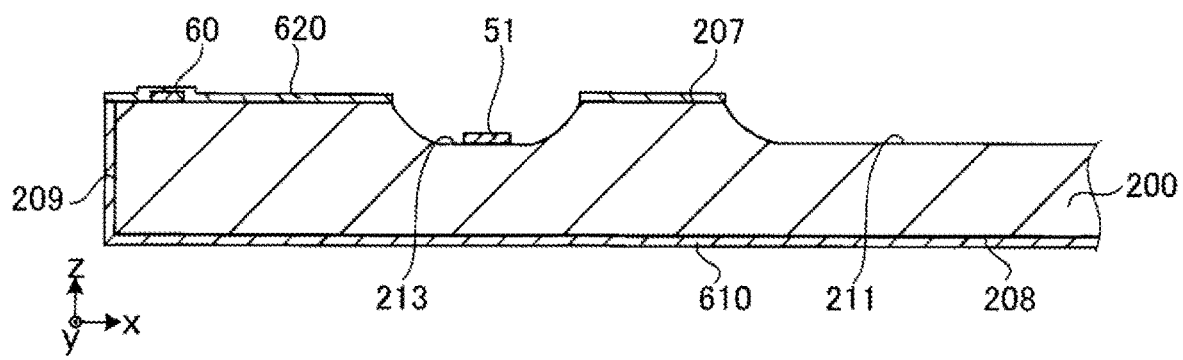
FIG. 13 is a cross-sectional view illustrating a first protruding portion formation step in the first exemplary embodiment.

FIG. 13 is a cross-sectional view illustrating the first protruding portion formation step in the first exemplary embodiment. In the first protruding portion formation step S13, the first protruding portion 51 is formed on the bottom surface of the second recessed portion 213. Specifically, first, the silicone film is formed on the first surface 207 by a vapor deposition method such as a CVD method. Subsequently, a resist mask having an opening corresponding to the shape of the first protruding portion 51 is formed, and a part of the silicone film is removed by dry etching through use of the mask. With this, the first protruding portion 51 illustrated in FIG. 13 is formed.

When the above-mentioned resist mask is formed, the light exposure mask is arranged with the opening edge 2130 of the second recessed portion 213 as a reference. With this, the opening corresponding to the first protruding portion 51 is formed. Specifically, the opening of the resist mask is formed so that a geometrical center of the opening of the resist mask in plan view, which corresponds to the first protruding portion 51, matches with the geometrical center O10 of the region surrounded by the opening edge 2130 of the second recessed portion 213. In this case, when a plane shape of the opening of the resist mask and a plane shape of the region surrounded by the opening edge 2130 of the second recessed portion 213 are analogous, the opening of the resist mask is formed so as to have the sides forming the plane shapes are parallel to each other. By forming the first protruding portion 51 with the second recessed portion 213 as a reference, the relative position of the first protruding portion 51 with respect to the first recessed portion 211 in plan view can be determined. Note that, the reference protruding portion 60 may be used as a reference.

Note that, in this step, a flattening treatment such as CMP may be performed after the silicone film is formed. For example, when the first protruding portion 51 is formed of a metal material, the first protruding portion 51 may be formed by a method in which a reflow treatment by heating is performed.

Second Lens Surface Formation Step S14

Figure 14:
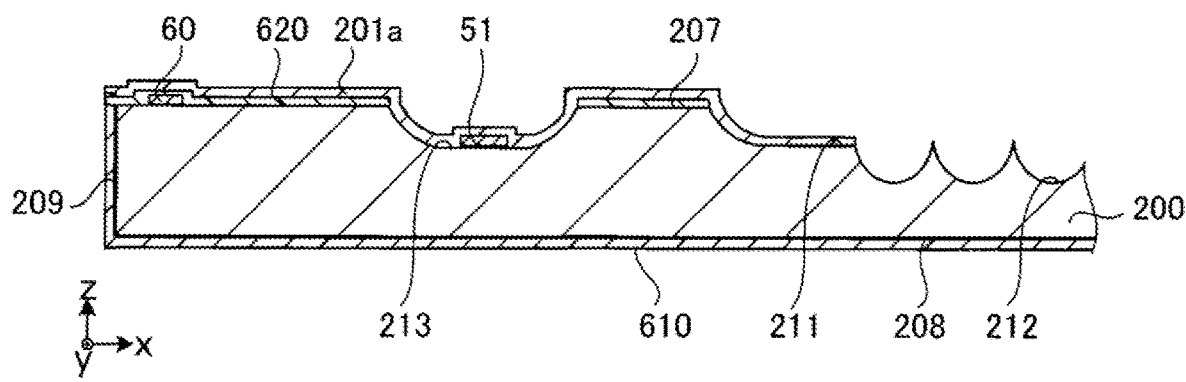
FIG. 14 is a cross-sectional view illustrating a second lens surface formation step in the first exemplary embodiment.

FIG. 14 is a cross-sectional view illustrating the second lens surface formation step in the first exemplary embodiment. In the second lens surface formation step S14, first, a first protective film 201a formed of, for example, a silicone oxide film, is formed on the first surface 207 by a vapor deposition method such as plasma CVD or the like. After that, annealing is performed. Subsequently, a resist mask including a plurality of openings corresponding to the plurality of second lens surfaces 212 is formed, and a part of the first protective film 201a and a part of the wafer 200 are removed by isotropic etching through use of the mask. With this, the plurality of second lens surfaces 212 having a curved surface shape, which are illustrated in FIG. 12, are formed. Note that, the first protective film 201a is formed into the first protective film 201 at the last stage after the later steps.

In the above-mentioned isotropic etching, wet etching through use of etching liquid containing fluorine is used. Note that, in the isotropic etching in this step, dry etching may be used. Performing the above-mentioned annealing, a residual stress of the wafer 200, which is generated in the processing in the former step is removed, thereby being capable of suppressing a warp of the wafer 200. By providing the first protective film 201a, a warp that may be caused in the wafer 200 by the annealing can be suppressed.

When the above-mentioned resist mask is formed, the plurality of openings corresponding to the plurality of second lens surfaces 212 are formed by arranging the light exposure mask with the first protruding portion 51 as a reference. By using the first protruding portion 51 as a reference, the relative positions of the second lens surfaces 212 with respect to the first protruding portion 51 in plan view are determined. The relative positions of the plurality of second lens surfaces 212 with respect to the first recessed portion 211 in plan view are determined.

Second Lens Layer Formation Step S15

Figure 15:
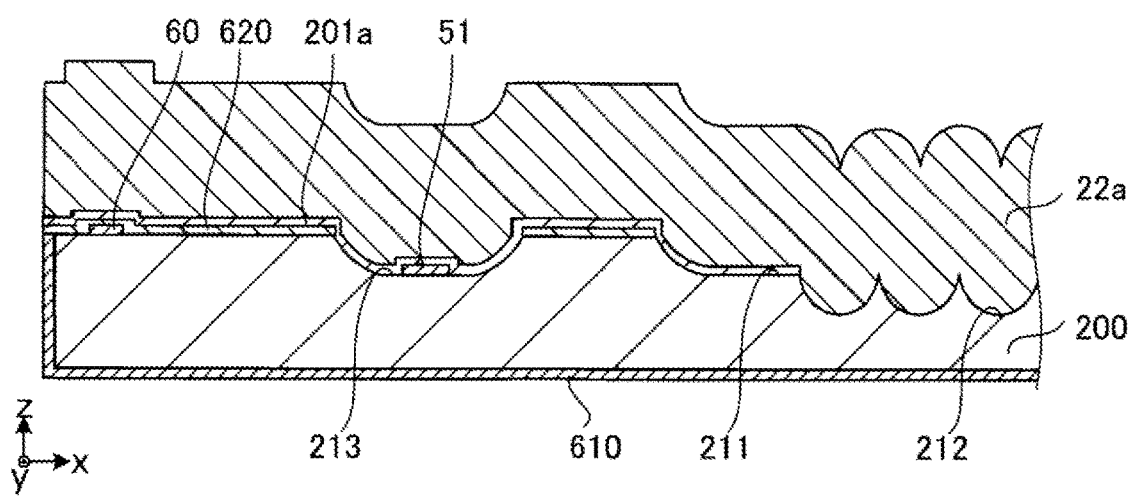
FIG. 15 is a cross-sectional view illustrating a second lens layer formation step in the first exemplary embodiment.
Figure 16:
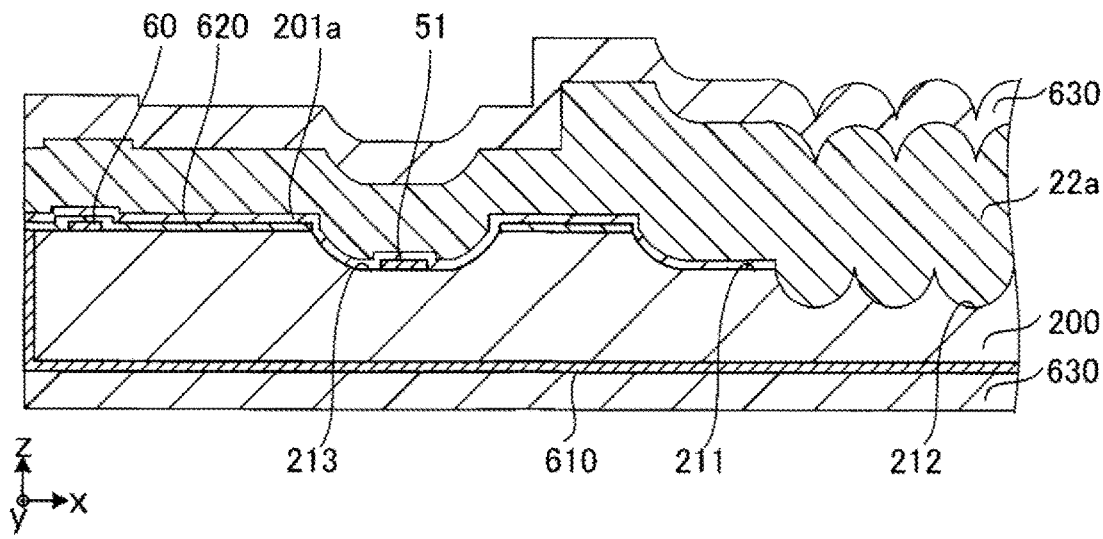
FIG. 16 is a cross-sectional view illustrating the second lens layer formation step in the first exemplary embodiment.
Figure 17:
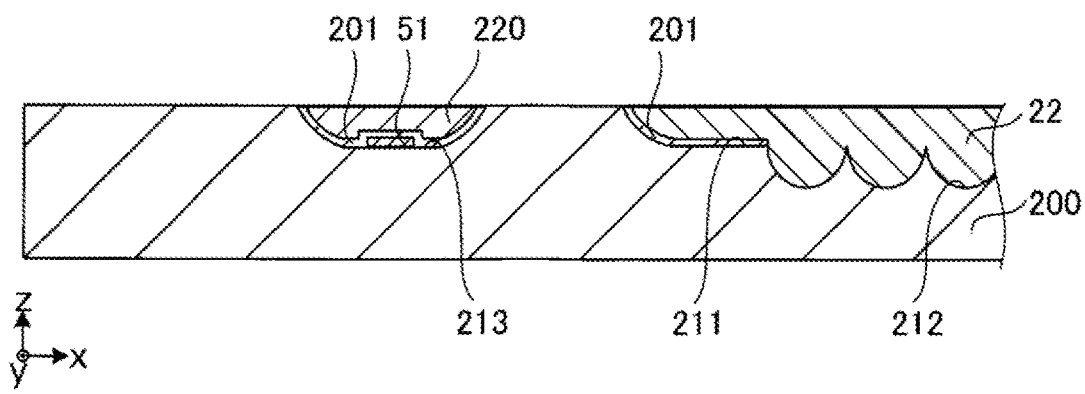
FIG. 17 is a cross-sectional view illustrating the second lens layer formation step in the first exemplary embodiment.

Each of FIG. 15 to FIG. 17 is a cross-sectional view illustrating the second lens layer formation step in the first exemplary embodiment. As illustrated in FIG. 15, in the second lens layer formation step S15, first, a film 22a for lens layer formation, which is formed of a silicone oxide film, is formed on the first surface 207 by a vapor deposition method such as CVD. Subsequently, as illustrated in FIG. 16, a part of the film 22a for lens layer formation is removed by dry etching. After that, an insulating film 630 containing tetraethyl orthosilicate (TEOS) is formed on the film 22a for lens layer formation. The insulating film 630 is also formed on the conductive layer 610 on the second surface 208 side. Subsequently, as illustrated in FIG. 17, the insulating film 630 and the film 22a for lens layer formation are subjected to a flattening treatment such as a CMP method. With this, the second lens layer 22, the filler layer 220, and the first protective film 201 are formed. The insulating film 630 and the conductive layer 610 are subjected to a flattening treatment such as a CMP method, and those components are removed.

Second Protective Layer Formation Step S16

Figure 18:
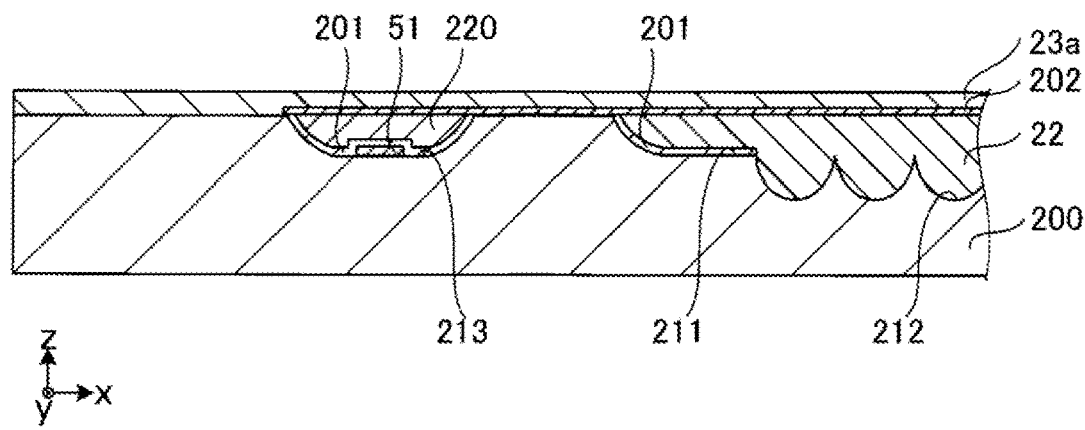
FIG. 18 is a cross-sectional view illustrating a second protective layer formation step in the first exemplary embodiment.

FIG. 18 is a cross-sectional view illustrating the second protective layer formation step in the first exemplary embodiment. In the second protective layer formation step S16, first, the second protective film 202 formed of, for example, a silicone nitride film, is formed on the second lens layer 22 and the filler layer 220 by a vapor deposition method such as CVD, etching, or the like. Subsequently, a second protective layer 23a formed of, for example, a silicone oxide film, is formed on the first surface 207 by a vapor deposition method such as CVD, a flattening treatment such as a CMP method, etching, or the like so as to cover the second protective film 202. Note that, the second protective layer 23a is a layer formed into the second protective layer 23 at the last stage by being divided.

By forming the second protective film 202, deformation of the wafer 200, which may be caused by annealing in a later step, can be suppressed as compared to a case where the component is not provided. By forming the second protective layer 23, the second lens layer 22 can be protected so as to prevent the surface of the second lens layer 22 from being removed by etching performed in a later step.

Second Protruding Portion Formation Step S17

Figure 19:
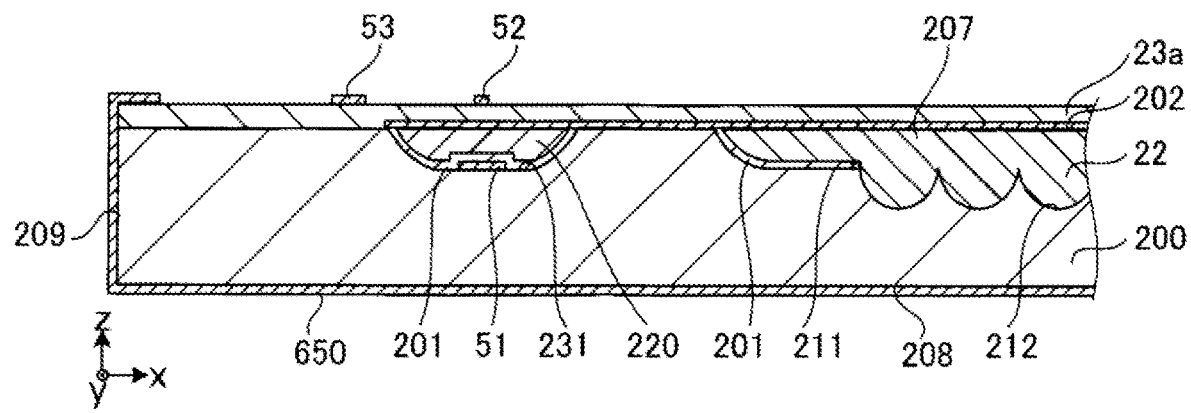
FIG. 19 is a cross-sectional view illustrating a second protruding portion formation step in the first exemplary embodiment.

FIG. 19 is a cross-sectional view illustrating the second protruding portion formation step in the first exemplary embodiment. In the second protruding portion formation step S17, the second protruding portion 52 and the third protruding portion 53 are formed on the second protective layer 23. Specifically, the silicone film is formed on the second protective layer 23, the second surface 208, and the side surface 209 by a vapor deposition method such as a CVD method. Subsequently, the silicone film is flattened by a flattening treatment such as a CMP method. Subsequently, a resist mask including a plurality of openings corresponding to the shape of the second protruding portion 52 and the shape of the third protruding portion 53 is formed, and a part of the silicone film is removed by dry etching such as ME. With this, the second protruding portion 52 and the third protruding portion 53 illustrated in FIG. 18 are formed. A reinforcing layer 650 arranged over the second surface 208, the side surface 209, and a part of the first surface 207 can be obtained.

By forming the reinforcing layer 650, such warp of the wafer 200 that the first surface 207 becomes convex can be suppressed when the TFTs 26 and the like of the wiring layer 20 are formed. The thickness of the reinforcing layer 650 is not particularly limited. However, it is preferred that the thickness be larger than the thickness of the conductive layer 610 described above, and the thickness may be set to, for example, approximately 4500 Å.

When the above-mentioned resist mask is formed, the plurality of openings corresponding to the second protruding portion 52 and the third protruding portion 53 are formed by arranging the light exposure mask with the first protruding portion 51 as a reference. Specifically, the opening of the resist mask is formed so that a geometrical center of the opening of the resist mask in plan view, which corresponds to the second protruding portion 52, matches with the geometrical center O1 of the first protruding portion 51. In this case, when a plane shape of the opening of the resist mask and a plane shape of the first protruding portion 51 are analogous, the opening of the resist mask is formed so as to have the sides forming the plane shapes are parallel to each other. By forming second protruding portion 52 and the third protruding portion 53 with the first protruding portion 51 as a reference, the relative positions of the second protruding portion 52 and the third protruding portion 53 with respect to the second lens surfaces 212 in plan view can be determined.

Light transmittance of the first protruding portion 51 is lower than light transmittance of each of the wafer 200, the first protective film 201, the filler layer 220, and the second protective layer 23. Thus, a contour of the first protruding portion 51 in plan view can be grasped easily through use of, for example, an optical microscope. Therefore, the relative position of the second protruding portion 52 with respect to the first protruding portion 51 in plan view can easily be determined.

Note that, for example, when the second protruding portion 52 and the third protruding portion 53 are formed of a metal material, the first protruding portion 51 may be formed by a method in which a reflow treatment by heating is performed. In the present exemplary embodiment, the first protruding portion 51 and the second protruding portion 52 overlap each other in plan view, but may not overlap each other. For example, the relative positional relationship of the first protruding portion 51 and the second protruding portion 52 may be determined by determining a separation distance between those components in plan view.

Optical Path Adjusting Layer Formation Step S18

Figure 20:
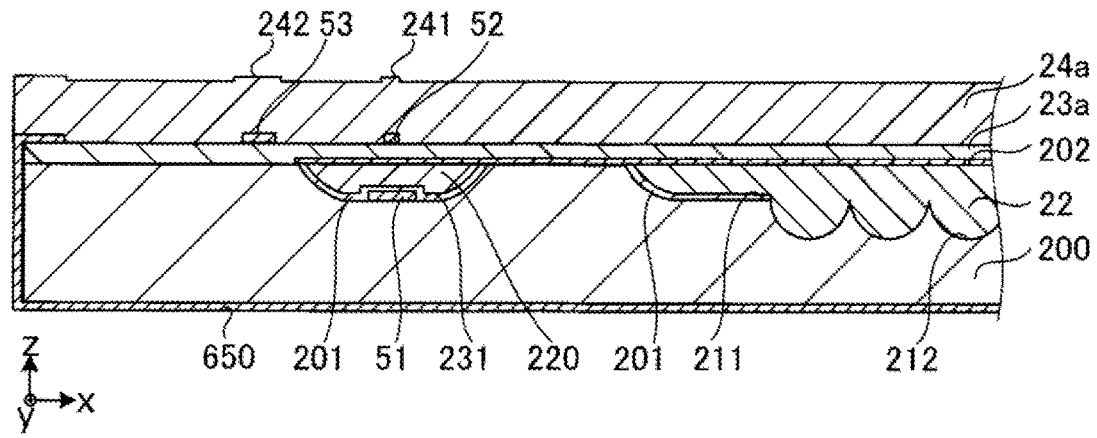
FIG. 20 is a cross-sectional view illustrating an optical path adjusting layer formation step in the first exemplary embodiment.

FIG. 20 is a cross-sectional view illustrating the optical path adjusting layer formation step in the first exemplary embodiment. In the optical path adjusting layer formation step S18, an optical path adjusting layer 24a formed of, for example, a silicone oxide film, is formed on the second protective layer 23 by a vapor deposition method such as CVD or the like. Note that, the optical path adjusting layer 24a is a layer formed into the optical path adjusting layer 24 at the last stage by being divided.

The thickness of the optical path adjusting layer 24 is set so as to adjust the condensing position of the light LL passing through the second lens surfaces 212 to a predetermined position outside the translucent portions A11 based on the shape of the second lens surfaces 212 and the refractive factor of each of the wafer 200 and the second lens layer 22. On the surface of the optical path adjusting layer 24 on the +z axis side, the first part 241 having a shape in conformity with the shape of the second protruding portion 52 and the second part 242 having a shape in conformity with the shape of the third protruding portion 53 are formed.

Wiring Layer Formation Step S19

Figure 21:
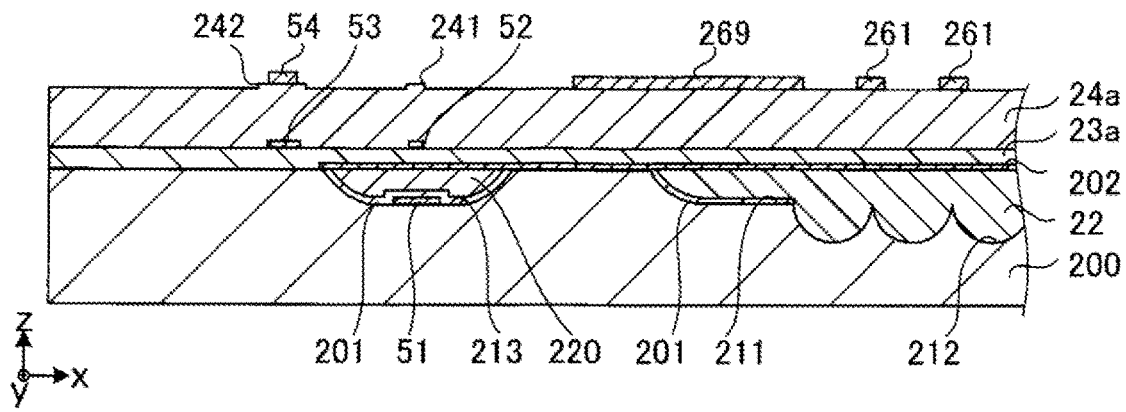
FIG. 21 is a cross-sectional view illustrating a wiring layer formation step in the first exemplary embodiment.
Figure 22:
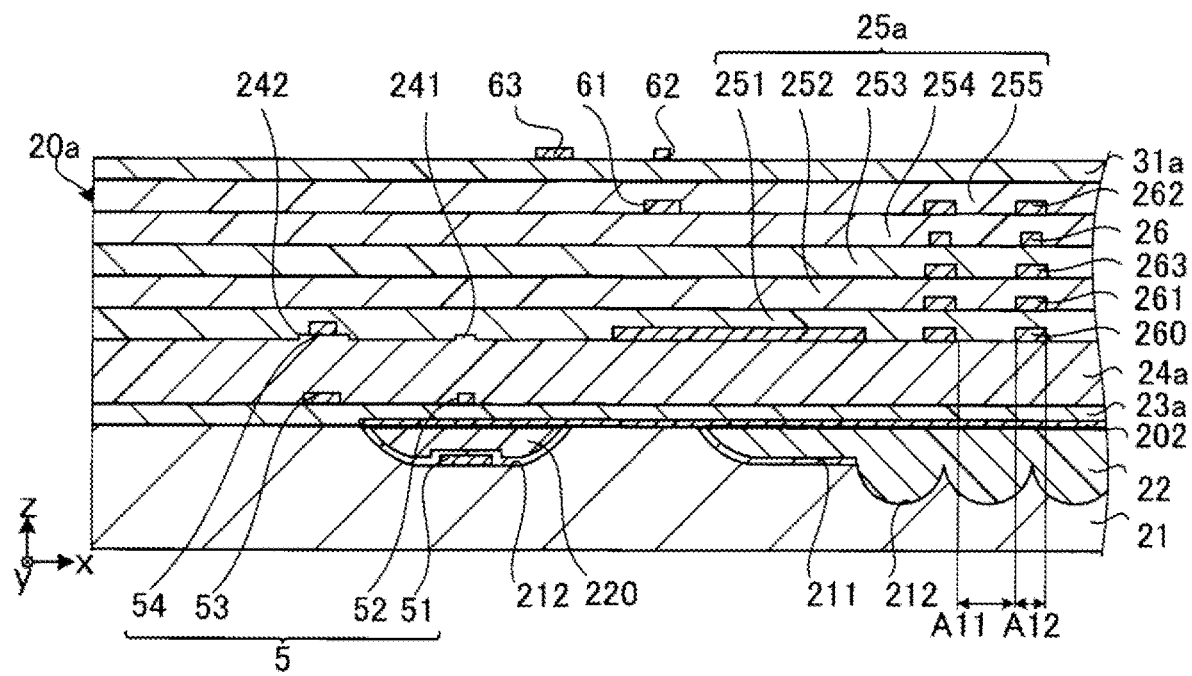
FIG. 22 is a cross-sectional view illustrating the wiring layer formation step and a second insulating layer formation step in the first exemplary embodiment.

FIG. 21 is a cross-sectional view illustrating the wiring layer formation step S19 in the first exemplary embodiment. FIG. 22 is a cross-sectional view illustrating the wiring layer formation step S19 and the second insulating layer formation step S20 in the first exemplary embodiment. The wiring layer formation step S19 includes a step of forming the wiring layer 20a, a step of forming the fourth protruding portion 54, and a step of forming the fifth protruding portion 61. That is, in the wiring layer formation step S19, together with formation of the wiring layer 20a, the fourth protruding portion 54 and the fifth protruding portion 61 are formed. Note that, the wiring layer 20a is a layer formed into the wiring layer 20 at the last stage by being divided.

Specifically, after forming a metal film by, for example, spattering or a vapor deposition method, the fourth protruding portion 54, the light shielding films 260, the light shielding film 269, the scanning lines 261, the capacitance lines 263, the TFTs 26, the signal lines 262, and the fifth protruding portion 61 are formed by subjecting the metal film to etching through use of a resist mask. Each layer of the insulating body 25 is formed by being subjected to a vapor deposition method and a flattening treatment performed with polishing such as CMP.

The fourth protruding portion 54 and the light shielding films 260 are formed collectively by etching through use of the same resist mask. Thus, the relative position of the fourth protruding portion 54 with respect to the light shielding films 260 in plan view is determined. When the resist mask is formed, a plurality of openings corresponding to the fourth protruding portion 54 and the light shielding films 260 are formed by arranging the light exposure mask with the second part 242 as a reference. Specifically, the opening of the resist mask is formed so that the geometrical center O4 of the opening of the resist mask in plan view, which corresponds to the fourth protruding portion 54, matches with the geometrical center O5 of the second part 242. In this case, when a plane shape of the opening of the resist mask and a plane shape of the second part 242 is analogous, the opening of the resist mask is formed so as to have the sides forming the plane shapes are parallel to each other. By forming the fourth protruding portion 54 and the light shielding films 260 with the second part 242 as a reference, the relative positions of the translucent portions A11 with respect to the second lens surfaces 212 in plan view can be determined. The light transmittance of the fourth protruding portion 54 is lower than the light transmittance of the optical path adjusting layer 24. Thus, a contour of the fourth protruding portion 54 in plan view can be grasped easily through use of, for example, an optical microscope. Therefore, the relative position of the fourth protruding portion 54 with respect to the second part 242 in plan view is determined easily.

In the present exemplary embodiment, the fifth protruding portion 61 and the signal lines 262 are formed collectively by etching through use of the same resist mask. Thus, the relative position of the fifth protruding portion 61 with respect to the signal lines 262 in plan view is determined. When the resist mask is formed, a plurality of openings corresponding to the fourth protruding portion 54 and the light shielding films 260 are formed by arranging the light exposure mask with the signal lines 262 as a reference. The signal lines 262 are formed so as to have portions overlapping with the light shielding films 260 in plan view. Thus, the fifth protruding portion 61 is positioned with respect to the light shielding films 260 and the fourth protruding portion 54 in plan view. Therefore, the fifth protruding portion 61 is positioned with respect to the first protruding portion 51 and the second lens surfaces 212.

Note that, in the present exemplary embodiment, after the wiring layer 20 is formed, the reinforcing layer 650 formed on the second surface 208 is removed. In the drawings after FIG. 21, a part of the reinforcing layer 650 formed on the first surface 207 is omitted.

Second Insulating Layer Formation Step S20

In the second insulating layer formation step S20, a second insulating layer 31a formed of, for example, a silicone nitride film, is formed on the wiring layer 20. The second insulating layer 31a is formed into the second insulating layer 31 after the later steps at the last stage by being divided. In this step, the sixth protruding portion 62 and the seventh protruding portion 63 are formed on the second insulating layer 31a. Specifically, the silicone film is formed on the second insulating layer 31a by a vapor deposition method such as a CVD method, and the silicone film is flattened by a flattening treatment such as a CMP method. Subsequently, a resist mask including a plurality of openings corresponding to the shape of the sixth protruding portion 62 and the shape of the seventh protruding portion 63 is formed, and a part of the silicone film is removed by dry etching through use of the mask. With this, the sixth protruding portion 62 and the seventh protruding portion 63 are formed.

Insulating Layer Formation Step S21

Figure 23:
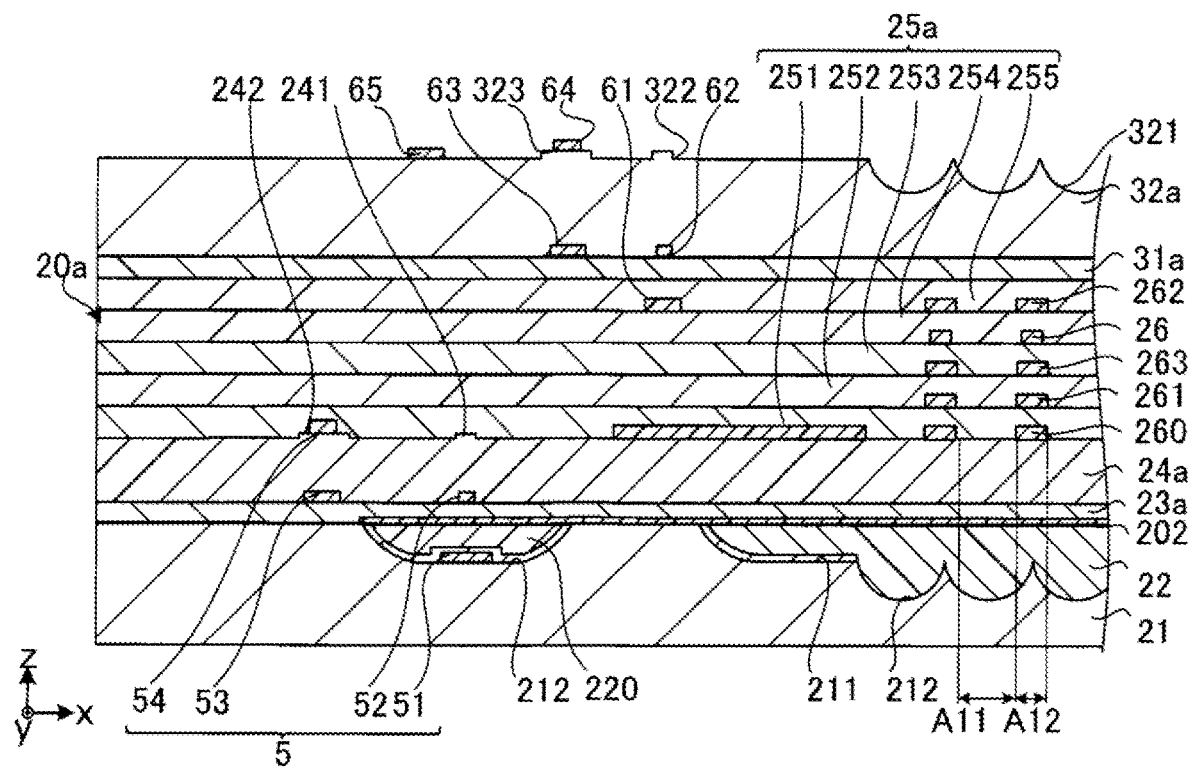
FIG. 23 is a cross-sectional view illustrating the insulating layer formation step, an eighth protruding portion formation step, and the lens surface formation step in the first exemplary embodiment.

FIG. 23 is a cross-sectional view illustrating the insulating layer formation step S21, the eighth protruding portion formation step S22, and the lens surface formation step S23 in the first exemplary embodiment. In the insulating layer formation step S21, an insulating layer 32a formed of, for example, a silicone nitride film, is formed by a vapor deposition method such as CVD. The insulating layer 32a is formed into the insulating layer 32 after the later steps at the last stage by being divided. On the surface of the insulating layer 32a on the +z axis side, the third part 322 having a shape in conformity with the shape of the sixth protruding portion 62 and the fourth part 323 having a shape in conformity with the shape of the seventh protruding portion 63 are formed.

Eighth Protruding Portion Formation Step S22

In the eighth protruding portion formation step S22, the eighth protruding portion 64 and the ninth protruding portion 65 are formed on the insulating layer 32a. Specifically, for example, the silicone film is formed on the insulating layer 32a by a vapor deposition method such as a CVD method. After that, a resist mask including a plurality of openings corresponding to the shape of the sixth protruding portion 62 and the shape of the seventh protruding portion 63 is formed, and the silicone film is subjected to etching through use of the mask. Note that, a metal film may be used in place of the silicone film.

When the resist mask is formed, the plurality of openings corresponding to the eighth protruding portion 64 and the ninth protruding portion 65 are formed by arranging the light exposure mask with the fourth part 323 as a reference. Specifically, the opening of the resist mask is formed so that the geometrical center O8 of the opening of the resist mask in plan view, which corresponds to the eighth protruding portion 64, matches with the geometrical center O30 of the fourth part 323. In this case, when a plane shape of the opening of the mask and a plane shape of the fourth part 323 are analogous, the opening of the resist mask is formed so as to have the sides forming the plane shapes are parallel to each other. By forming the eighth protruding portion 64 and the ninth protruding portion 65 with the fourth part 323 as a reference, the relative positions of the eighth protruding portion 64 and the ninth protruding portion 65 with respect to the translucent portions A11 in plan view can be determined. The light transmittance of the eighth protruding portion 64 is lower than the light transmittance of the insulating layer 32a. Thus, such configuration is preferred because a contour of the eighth protruding portion 64 in plan view can be grasped easily through use of, for example, an optical microscope.

Lens Surface Formation Step S23

In the lens surface formation step S23, a resist mask including a plurality of openings corresponding to the plurality of lens surfaces 321 is formed, and a part of the insulating layer 32a by isotropic etching through use of the mask. With this, the plurality of lens surfaces 321 including a concave surface shape are formed, and the insulating layer 32a including the plurality of lens surfaces 321 is obtained.

When the above-mentioned resist mask is formed, by arranging the light exposure mask with the eighth protruding portion 64 as a reference, the plurality of openings corresponding to the plurality of lens surfaces 321 are formed. Through use of the eighth protruding portion 64 as a reference, the relative positions of the lens surfaces 321 with respect to the translucent portions A11 in plan view can be determined, and a positional difference of the lens surfaces 321 with reference to the translucent portions A11 can sufficiently be reduced.

Lens Layer Formation Step S24

Figure 24:
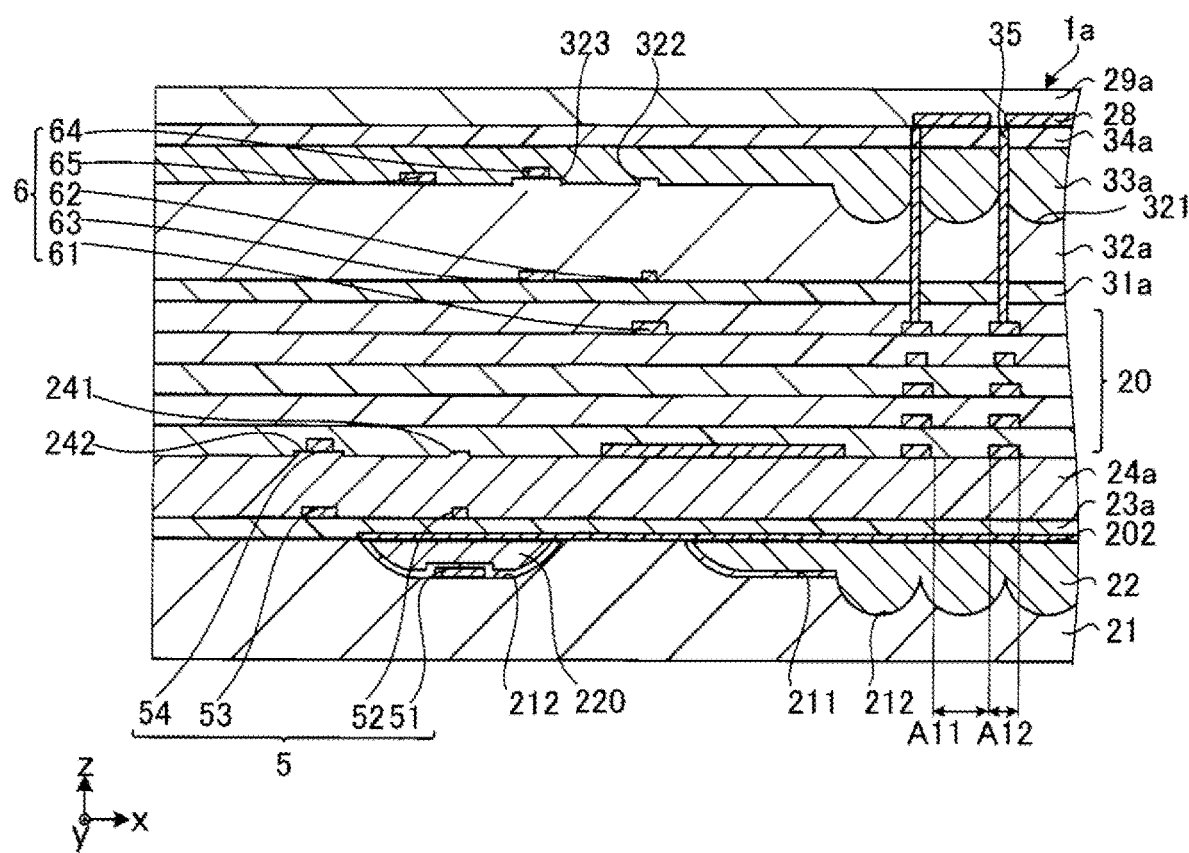
FIG. 24 is a cross-sectional view illustrating the lens layer formation step, a pixel electrode formation step, and an alignment film formation step in the first exemplary embodiment.

FIG. 24 is a cross-sectional view illustrating the lens layer formation step S24, the pixel electrode formation step S25, and the alignment film formation step S26 in the first exemplary embodiment. In the lens layer formation step S24, the lens layer 33 formed of, for example, a silicone nitride film, is formed on the insulating layer 32a by a vapor deposition method such as CVD, a flattening treatment such as a CMP method, or the like. Note that, dry etching or a flattening treatment such as a CMP method may be used as appropriate. In this step, after the lens layer 33 is formed, the first protective layer 34 formed of, for example, a silicone nitride film, is formed on the lens layer 33 by a vapor deposition method such as CVD, a flattening treatment such as a CMP method, or the like.

Pixel Electrode Formation Step S25

In the pixel electrode formation step S25, although not illustrated in detail, the pixel electrodes 28 are formed on the translucent portions A11 of the wiring layer 20. The pixel electrodes 28 are formed in such a manner that a layer formed of, for example, a transparent electrode material is formed by a vapor deposition method such as a CVD method and then patterning is performed through use of a mask. When the pixel electrodes 28 are formed, the through electrodes 35 are formed. Regarding the through electrodes 35, through holes are formed with the ninth protruding portion 65 as a reference. Through use of the ninth protruding portion 65, which is formed together with the eighth protruding portion 58, as a reference, a positional difference of the pixel electrodes 28 with respect to the translucent portions A11 can be reduced.

Alignment Film Formation Step S26

In the alignment film formation step S26, for example, a layer formed of polyimide is formed by a vapor deposition method such as a CVD method, and then is subjected to a rubbing treatment. In this manner, an alignment film 29a is formed. Note that, the alignment film 29a is a layer formed into the alignment film 29 at the last stage by being divided.

After performing the reference protruding portion formation step S11 to the alignment film formation step S26 described above, a plurality of mother substrates 1a are formed as members for manufacturing an electro-optical device, which is use for forming the electro-optical device 100, as illustrated in FIG. 24.

Dividing Step S27

In the dividing step S27, although not illustrated in detail, the mother substrates 1a are divided into the regions 21a illustrated in FIG. 10. The plurality of element substrates 1 are obtained by being divided into dice. In the manner as described above, the element substrate 1 illustrated in FIG. 4 can be formed.

For example, the counter substrate 7 is formed by appropriately using a known technology, and the counter substrate 7 is bonded to the element substrate 1 through intermediation of the sealing member 8. After that, a liquid crystal material is injected between the element substrate 1, the counter substrate 7, and the sealing member 8 to form the liquid crystal layer 9, and then sealing is performed. Further, various circuits and the like are formed as appropriate in the steps described above or between the steps. In such a manner, the electro-optical device 100 illustrated in FIG. 1 and FIG. 2 can be manufactured.

As described above, the method of manufacturing the element substrate 1 includes the wiring layer formation step S19, the insulating layer formation step S21, the eighth protruding portion formation step S22, the lens surface formation step S23, the lens layer formation step S24, and the pixel electrode formation step S25. The wiring layer formation step S19 includes a step of forming the wiring layer 20a, and a step of forming the fifth protruding portion 61, and a part of the steps are performed simultaneously in the present exemplary embodiment. By performing the insulating layer formation step S21 and the lens surface formation step S23, the insulating layer 32a including the plurality of lens surfaces 321 can be obtained. According to the method of manufacturing the element substrate 1, as described above, the fifth protruding portion 61, which is formed of the same layer as the signal lines 262 of the wiring layer 20a, and the eighth protruding portion 64 contact with the insulating layer 32a can be formed. Thus, by using the fifth protruding portion 61 and the eighth protruding portion 64 as a reference for positioning, the relative positioning of the lens surfaces 321 and the translucent portions A11 can be performed at high accuracy.

Further, as described above, the first protruding portion formation step S13, the second lens surface formation step S14, the second lens layer formation step S15, and the optical path adjusting layer formation step S18 are included. The wiring layer formation step S19 described above includes a step of forming the wiring layer 20a and a step of forming the fourth protruding portion 54, and a part of the steps are performed simultaneously in the present exemplary embodiment. According to the method of manufacturing the element substrate 1, the first protruding portion 51 formed on the wafer 200 and the fourth protruding portion 54 formed of the same layer as a part of the wiring layer 20a can be formed. Thus, by using the first protruding portion 51 and the fourth protruding portion 54 as a reference for positioning, the relative positioning of the second lens surfaces 212 and the translucent portions A11 in plan view can be performed at high accuracy.

According to the method of manufacturing the element substrate 1, by using the second position adjusting portion 5 and the first position adjusting portion 6, the positional shift among the plurality of second lens surfaces 212, the plurality of translucent portions A11, the plurality of lens surfaces 321, and the plurality of pixel electrodes 28 in plan view can be reduced.

As described above, the plurality of element substrates 1 can be formed by dividing the mother substrates 1a. In the mother substrate 1a, the second position adjusting portion 5 and the first position adjusting portion 6 are provided for each of the regions 21a. Thus, in the plurality of element substrates 1 formed by being divided into dice, the positional shift among the plurality of second lens surfaces 212, the plurality of translucent portions A11, the plurality of lens surfaces 321, and the plurality of pixel electrodes 28 in plan view can be reduced. Therefore, efficiency in utilizing the light in the element substrate 1 can be improved.

Note that, in the present exemplary embodiment, the second position adjusting portion 5 and the first position adjusting portion 6 are provided for the region 21a, but may not be provided for the region 21a. The second position adjusting portion 5 and the first position adjusting portion 6 may be provided outside the region 21a. However, it is preferred that the mother substrates 1a two or more first position adjusting portions 6 and two or more second position adjusting portions 5 be provided to the mother substrates 1a.

1-2. Second Exemplary Embodiment

Figure 25:
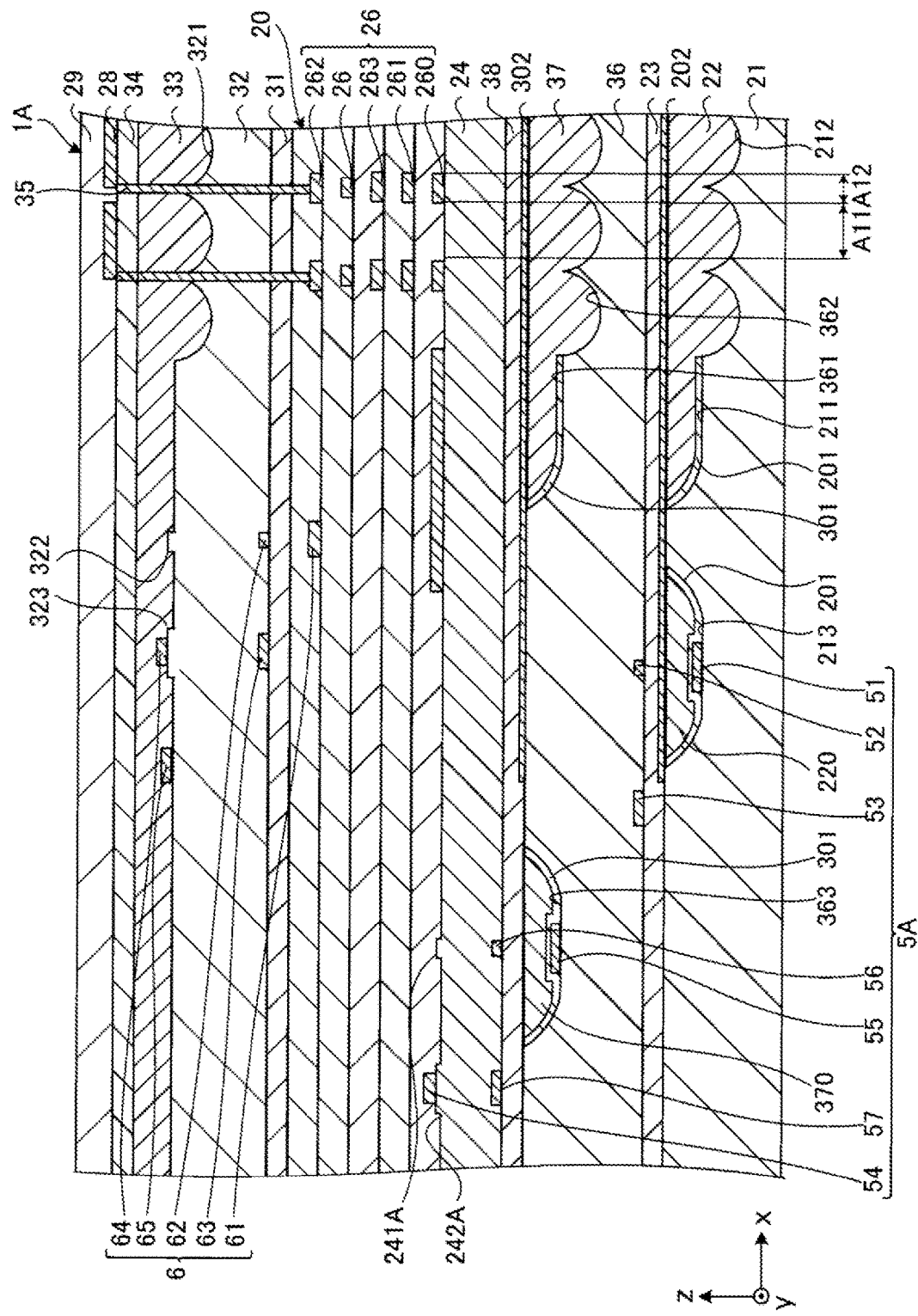
FIG. 25 is a cross-sectional view schematically illustrating a configuration of an element substrate in a second exemplary embodiment.
Figure 26:
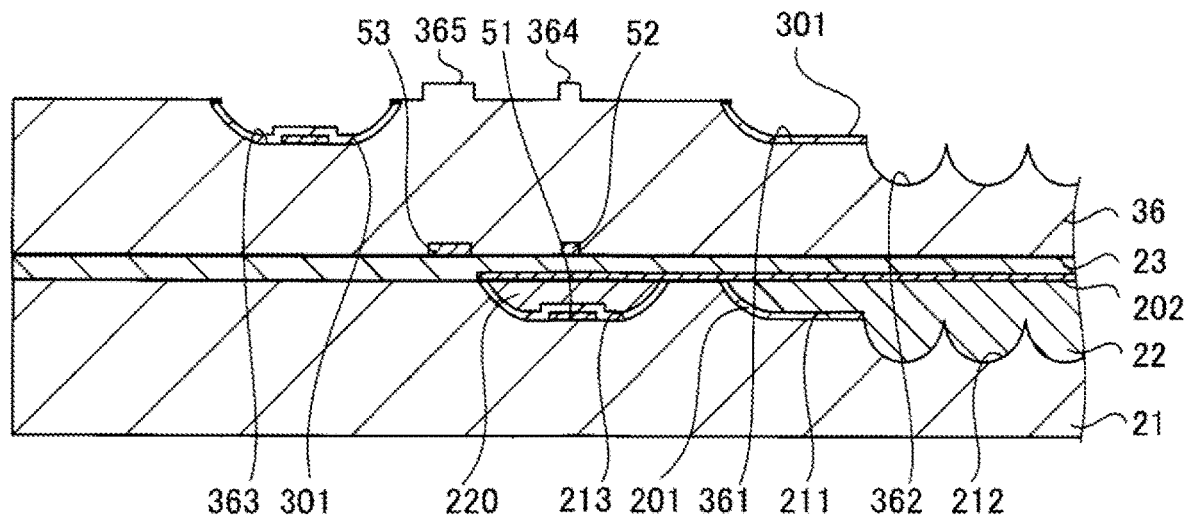
FIG. 26 is a cross-sectional view illustrating a method of manufacturing an element substrate in the second exemplary embodiment.
Figure 27:
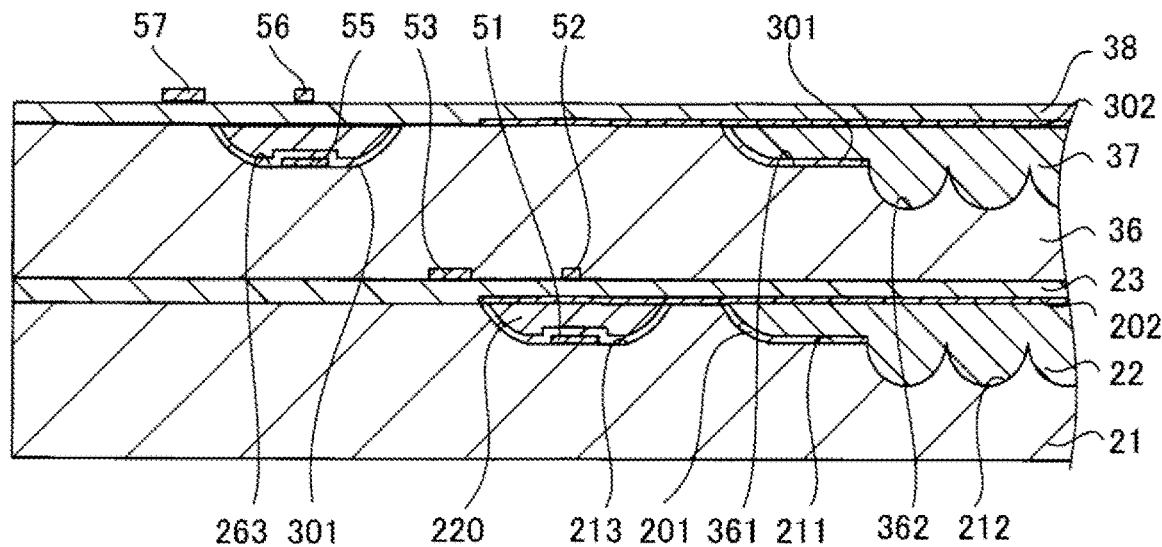
FIG. 27 is a cross-sectional view illustrating the method of manufacturing an element substrate in the second exemplary embodiment.

Next, a second exemplary embodiment of the present disclosure is described. FIG. 25 is a cross-sectional view schematically illustrating a configuration of an element substrate 1A in the second exemplary embodiment. Each of FIG. 26 and FIG. 27 is a cross-sectional view illustrating the method of manufacturing the element substrate 1A in the second exemplary embodiment. A configuration of the element substrate 1A in the present exemplary embodiment is different from that in the first exemplary embodiment. Note that, the matters in the second exemplary embodiment, which are similar to those in the first exemplary embodiment, are denoted with the reference symbols used in the description for the first exemplary embodiment, and detailed description therefor is omitted as appropriate.

The element substrate 1A illustrated in FIG. 25 further includes a third insulating layer 36, a third lens layer 37, and a third protective layer 38. The third insulating layer 36, the third lens layer 37, and the third protective layer 38 arranged between the second protective layer 23 and the optical path adjusting layer 24, and are arrayed in the stated order from the second protective layer 23 to the optical path adjusting layer 24. A second position adjusting portion 5A further includes a tenth protruding portion 55, an eleventh protruding portion 56, and a twelfth protruding portion 57.

Third Insulating Layer 36

The third insulating layer 36 is configured similarly to the base plate 21 except for that the constituent material is, for example, silicone oxide. That is, the third insulating layer 36 includes a third recessed portion 361 and a fourth recessed portion 363 positioned on the outer side of the third recessed portion 361 in plan view. A plurality of third lens surfaces 362 having a concave surface shape are provided in the bottom surface of the third recessed portion 361. The tenth protruding portion 55 is arranged in the fourth recessed portion 363. A third protective film 301 formed of, for example, a silicone nitride film, is arranged on a part of the third recessed portion 361 and the fourth recessed portion 363. The third protective film 301 is arranged so as to cover the tenth protruding portion 55, and protects the tenth protruding portion 55. Note that, the third protective film 301 may be omitted.

The first recessed portion 211 and the third recessed portion 361 overlap each other in plan view. The second lens surfaces 212 and the third lens surfaces 362 overlap with each other in plan view. In the illustrated example, the second recessed portion 213 and the fourth recessed portion 363 do not overlap each other in plan view, but may overlap each other.

Third Lens Layer 37

The third lens layer 37 is configured similarly to the second lens layer 22. That is, the third lens layer 37 is contact with the third lens surfaces 362, and is arranged on the third insulating layer 36 so as to fill in the third recessed portion 361. The third lens surfaces 362 and the third lens layer 37 form a lens, and in the present exemplary embodiment, a refractive factor of the third lens layer 37 is larger than a refractive factor of the third insulating layer 36.

A second filler layer 370 is arranged in the fourth recessed portion 363 described above. The second filler layer 370 is configured similarly to the filler layer 220. That is, the second filler layer 370 is arranged in contact with the third protective film 301 so as to fill in the fourth recessed portion 363. On the third lens layer 37 and the filler layer 220, a fourth protective film 302 formed of, for example, a silicone nitride film is arranged. The fourth protective film 302 is configured similarly to the second protective film 202. Note that, the fourth protective film 302 may be omitted.

Third Protective Layer 38

The third protective layer 38 is configured similarly to the second protective layer 23. The second protective layer 23 is arranged on the third insulating layer 36, and protects the third lens layer 37.

Tenth Protruding Portion 55

The tenth protruding portion 55 corresponds to a "sixth mark". The tenth protruding portion 55 is configured similarly to the first protruding portion 51. The tenth protruding portion 55 is arranged in contact with the third insulating layer 36, and protrudes from the third insulating layer 36 to the third protective layer 38.

Eleventh Protruding Portion 56

The eleventh protruding portion 56 is configured similarly to the second protruding portion 52. The eleventh protruding portion 56 is arranged in contact with the third protective layer 38, and protrudes from the third protective layer 38 to the optical path adjusting layer 24. The eleventh protruding portion 56 overlaps the fifth protruding portion 61 in plan view. A plane area of the eleventh protruding portion 56 is smaller than a plane area of the tenth protruding portion 55. A geometrical center of the eleventh protruding portion 56 in plan view matches with a geometrical center of the tenth protruding portion 55 in plan view. A second opening edge 3630 of the fourth recessed portion 363 has a rectangular shape in plan view, and the geometrical center of the tenth protruding portion 55 in plan view matches with a geometrical center of a region surrounded by the second opening edge 3630 in plan view. The region surrounded by the second opening edge 3630 of the fourth recessed portion 363, the plane shape of the tenth protruding portion 55, and the plane shape of the eleventh protruding portion 56 are substantially analogous, and have sides forming the plane shapes, which are substantially parallel to each other.

Twelfth Protruding Portion 57

The twelfth protruding portion 57 is configured similarly to the third protruding portion 53. That is, the twelfth protruding portion 57 is arranged in contact with the third protective layer 38, and protrudes from the third protective layer 38 to the optical path adjusting layer 24. The twelfth protruding portion 57 is arranged on the same plane as the eleventh protruding portion 56, and a plane are of the twelfth protruding portion 57 is larger than a plane area of the eleventh protruding portion 56. In the present exemplary embodiment, a first part 241A of the optical path adjusting layer 24 has a shape in conformity with the shape of the eleventh protruding portion 56, and the second part 242A has a shape in conformity with the shape of the twelfth protruding portion 57.

In the present exemplary embodiment, an element substrate 1B includes the third insulating layer 36, the third lens layer 37, and the tenth protruding portion 55. The third insulating layer 36 has translucency, includes the third lens surfaces 362 having a spherical surface shape, and is arranged between the optical path adjusting layer 24 and the second lens layer 22. The third lens layer 37 has translucency, is arranged between the optical path adjusting layer 24 and the third insulating layer 36, is contact with the third lens surfaces 362, and is arranged on the third insulating layer 36. The tenth protruding portion 55 is contact with the third insulating layer 36, and is arranged between the optical path adjusting layer 24 and the third insulating layer 36.

Even when the element substrate 1A includes the second lens surfaces 212 and the third lens surfaces 362 on the −z axis side of the wiring layer 20, the relative positioning of the second lens surfaces 212 and the third lens surfaces 362 in plan view can be performed at high accuracy by providing the second position adjusting portion 5A. Thus, the positional shift among the second lens surfaces 212, the third lens surfaces 362, the translucent portions A11, and the pixel electrodes 28 in plan view can be reduced.

Next, a method of manufacturing the element substrate 1A is described. The method of manufacturing the element substrate 1A according to the present exemplary embodiment includes an insulating layer formation step, a third recessed portion formation step, a fifth protruding portion formation step, a third lens surface formation step, a third lens layer formation step, and a third protective layer formation step. Those steps are performed in the stated order between the second protruding portion formation step S17 and the optical path adjusting layer formation step S18 illustrated in FIG. 7.

In the insulating layer formation step, a silicone oxide film is formed on the second protective layer 23 by a vapor deposition method such as a CVD method, and then is subjected to a flattening treatment such as a CMP method. In this manner, the third insulating layer 36 is formed. The third recessed portion formation step is similar to the first recessed portion formation step S12. The fifth protruding portion formation step is similar to the first protruding portion formation step. The third lens surface formation step is similar to the second lens surface formation step S14. The third lens layer formation step is similar to the second lens layer formation step S15. The third protective layer formation step is similar to the second protective layer formation step S16.

Here, as illustrated in FIG. 26, when the third insulating layer 36 is formed on the second protective layer 23, a fifth part 364 having a shape in conformity with the shape of the second protruding portion 52 and a sixth part 365 having a shape in conformity with the shape of the third protruding portion 53 are formed on the surface of the third insulating layer 36 on the +z axis side. That is, the fifth part 364 in which a film thickness of the second protruding portion 52 is reflected is formed into a plane shape similar to that of the second protruding portion 52, and the sixth part 365 in which a film thickness of the third protruding portion 53 is reflected is formed into a plane shape similar to that of the third protruding portion 53.

When the third recessed portion 361 is formed, the third recessed portion 361 is relatively positioned with respect to the first recessed portion 211 in plan view by arranging the light exposure mask with the sixth part 365 as a reference. Note that, although not illustrated, a second reference protruding portion configured similarly to the reference protruding portion 60 is formed on the third insulating layer 36, and the positioning may be performed with the second reference protruding portion as a reference.

When the tenth protruding portion 55 is formed, the tenth protruding portion 55 is formed in the bottom portion of the fourth recessed portion 363 so as to determine the relative position of the tenth protruding portion 55 with respect to the fourth recessed portion 363. When the third lens surfaces 362 is formed, the positions of the plurality of third lens surfaces 362 with respect to the third recessed portion 361 are determined by arranging the light exposure mask with the tenth protruding portion 55 as a reference. Thus, the relative positions of the plurality of third lens surfaces 362 with respect to the plurality of second lens surfaces 212 in plan view are determined.

Note that, as illustrated in FIG. 27, the fifth part 364 and the sixth part 365 are removed by a flattening treatment at the time of forming the third lens layer 37.

Even when the plurality of second lens surfaces 212 and the third lens surfaces 362 are provided as described above, the relative positional relationship of the second lens surfaces 212 and the third lens surfaces 362 in plan view can be adjusted at high accuracy by providing the second position adjusting portion 5A. Thus, the positional shift among the second lens surfaces 212, the third lens surfaces 362, the translucent portions A11, the lens surfaces 212, and the pixel electrodes 28 in plan view can be reduced.

1-3. Third Exemplary Embodiment

Figure 28:
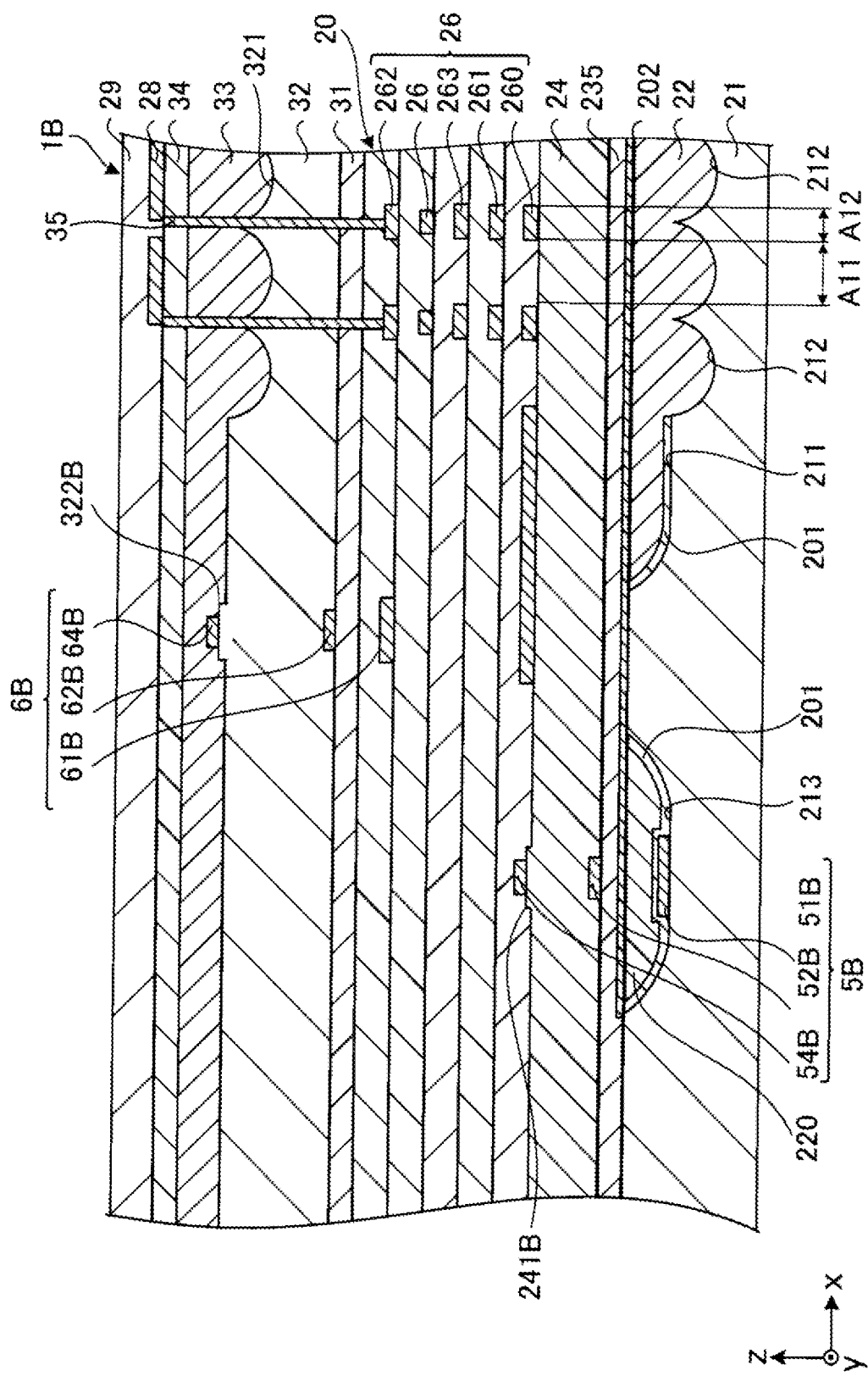
FIG. 28 is a cross-sectional view schematically illustrating a configuration of an element substrate in a third exemplary embodiment.

Next, a third exemplary embodiment of the present disclosure is described. FIG. 28 is a cross-sectional view schematically illustrating a configuration of an element substrate 1B in the third exemplary embodiment. A configuration of a second position adjusting portion 5B in the present exemplary embodiment is different from that in the first exemplary embodiment. Note that, the matters in the third exemplary embodiment, which are similar to those in the first exemplary embodiment, are denoted with the reference symbols used in the description for the first exemplary embodiment, and detailed description therefor is omitted as appropriate.

The second position adjusting portion 5B of the element substrate 1B illustrated in FIG. 28 includes a first protruding portion 51B, the second protruding portion 52B, and a fourth protruding portion 54B, and the third protruding portion 53 in the first exemplary embodiment is omitted. In the present exemplary embodiment, the first protruding portion 51B, the second protruding portion 52B, and the fourth protruding portion 54B overlap one another in plan view. A plane shape of the first protruding portion 51B and a plane shape of the second protruding portion 52B are larger than those in the first exemplary embodiment. A first part 241B of the optical path adjusting layer 24 is larger than that in the first exemplary embodiment. When a contour of each of the first protruding portion 51B, the second protruding portion 52B, and the first part 241B can be grasped easily, the third protruding portion 53 may be omitted, and the second protruding portion 52B and the fourth protruding portion 54B can be formed on the first part 241B.

A first position adjusting portion 6B of the element substrate 1B includes a fifth protruding portion 61B, a sixth protruding portion 62B, and an eighth protruding portion 64B, and the seventh protruding portion 63 and the ninth protruding portion 65 in the first exemplary embodiment are omitted. In the present exemplary embodiment, the fifth protruding portion 61B, the sixth protruding portion 62B, and the eighth protruding portion 64B overlap one another in plan view. A plane shape of the fifth protruding portion 61B, a plane shape of the sixth protruding portion 62B, and a plane shape of the eighth protruding portion 64B are larger than those in the first exemplary embodiment. A third part 322B of the insulating layer 32 is larger than that in the first exemplary embodiment. When a contour of each of the fifth protruding portion 61B, the sixth protruding portion 62B, and the eighth protruding portion 64B can be grasped easily, the seventh protruding portion 63 and the ninth protruding portion 65 can be omitted.

Also with the present exemplary embodiment, by using the second position adjusting portion 5B and the first position adjusting portion 6B, one translucent portion A11, one lens surface 321, and one pixel electrode 28 can overlap with respect to one second lens surface 212 in plan view at high accuracy. Thus, efficiency in utilizing the light LL in the element substrate 1 can be improved.

2. Electronic Apparatus

The electro-optical device 100 is applicable to various electronic apparatus.

Figure 29:
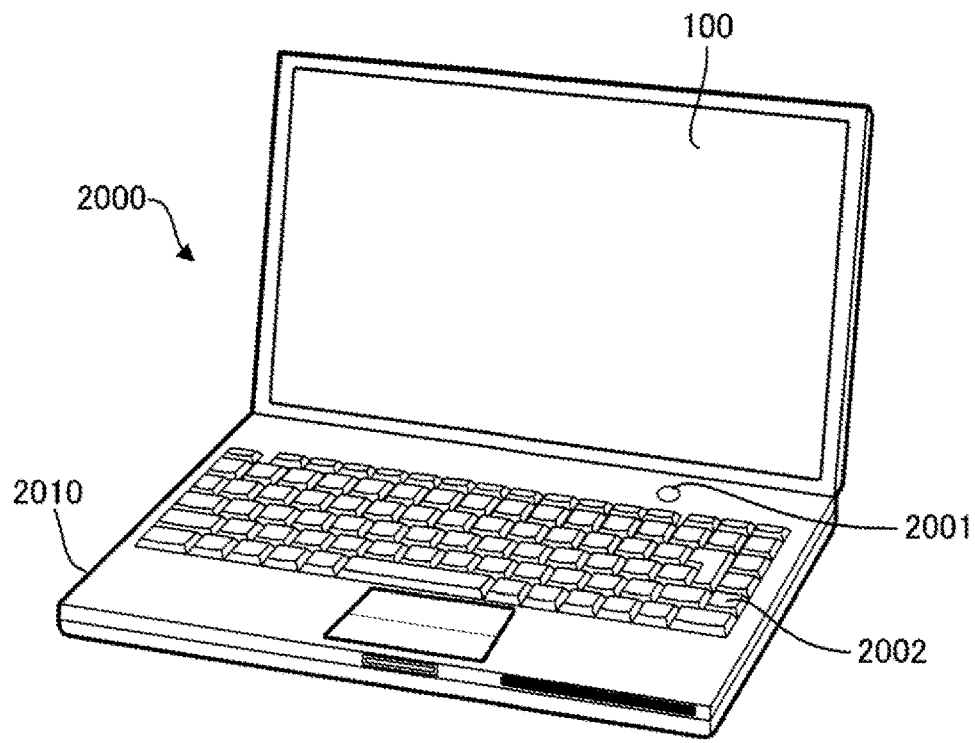
FIG. 29 is a perspective view illustrating a personal computer as an example of an electronic apparatus.

FIG. 29 is a perspective view illustrating a personal computer 2000 as an example of an electronic apparatus. The personal computer 2000 includes the electro-optical device 100 configured to display various images, and a main body unit 2010 in which a power source switch 2001 and a keyboard 2002 are installed.

Figure 30:
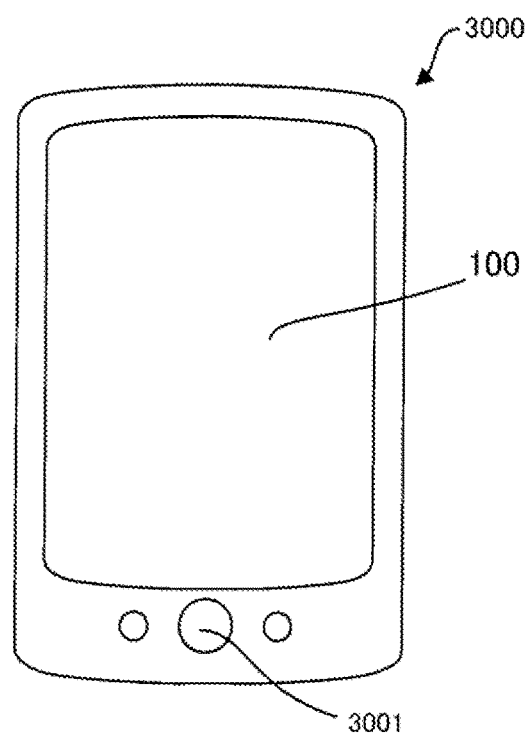
FIG. 30 is a perspective view illustrating a smartphone as an example of an electronic apparatus.

FIG. 30 is a perspective view illustrating a smartphone 3000 as an example of an electronic apparatus. The smartphone 3000 includes operation buttons 3001 and the electro-optical device 100 configured to display various images. An image content displayed by the electro-optical device 100 is changed in accordance with an operation of the operation buttons 3001.

Figure 31:
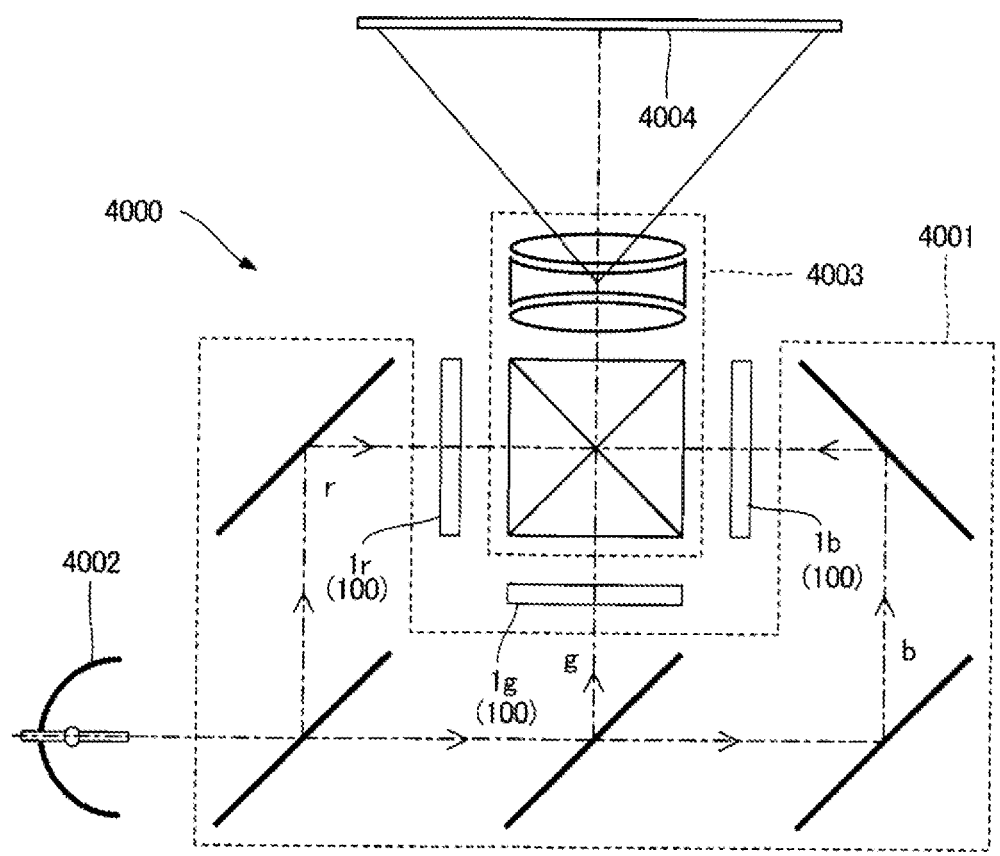
FIG. 31 is a schematic diagram illustrating a projector as an example of an electronic apparatus.

FIG. 31 is a schematic diagram illustrating a projector as an example of an electronic apparatus. The projection-type display device 4000 is a three-plate type projector, for example. An electro-optical device 1*r* is the electro-optical device 100 corresponding to a red display color, an electro-optical device 1*g* is the electro-optical device 100 corresponding to a green display color, and an electro-optical device 1*b* is the electro-optical device 100 corresponding to a blue display color. Specifically, the projection-type display device 4000 includes three electro-optical devices 1*r*, 1*g*, and 1*b* that respectively correspond to display colors of red, green, and blue.

An illumination optical system 4001 supplies a red element r of light emitted from an illumination device 4002 as a light source to an electro-optical device 1*r*, a green element g of the light to the electro-optical device 1*g*, and a blue element b of the light to the electro-optical device 1*b*. Each of the electro-optical devices 1*r*, 1*g*, and 1*b* functions as an optical modulator, such as a light bulb, that modulates respective rays of the monochromatic light supplied from the illumination optical system 4001 in accordance with display images. A projection optical system 4003 combines the rays of the light emitted from each of the electro-optical devices 1*r*, 1*g*, and 1*b* to project the combined light to a projection surface 4004.

Each of the personal computer 2000, the smartphone 3000, and the projection-type display device 4000 described above includes the electro-optical device 100 described above. By providing the electro-optical device 100, display homogeneity of the personal computer 2000, the smartphone 3000, and the projection-type display device 4000 can be improved. Thus, quality of the personal computer 2000, the smartphone 3000, and the projection-type display device 4000 can be improved.

Note that, the electronic apparatus to which the electro-optical device according to the present disclosure is not limited to the exemplified apparatus, but may include, for example, a personal digital assistant (PDA), a digital still camera, a television, a video camera, a car navigation device, a display device for in-vehicle use, an electronic organizer, an electronic paper, an electronic calculator, a word processor, a workstation, a visual telephone, a point-of-sales (POS) terminal, and the like. Further, as an electronic device to which the present disclosure is applied, a printer, a scanner, a copying machine, a video player, a touch panel, and the like are exemplified.

The present disclosure is described above based on the preferred exemplary embodiments, but the present disclosure is not limited to the exemplary embodiments described above. In addition, the configuration of each component of the present disclosure may be replaced with any configuration that exerts the equivalent functions of the above-described embodiments, and to which any configuration may be added.

In the description give above, the liquid crystal display device is given as an example of the electro-optical device according to the present disclosure, but the electro-optical device according to the present disclosure is not limited thereto. Specifically, it is only required that an electro-optical device have an optical property changed depending on electric energy. For example, similarly to the exemplary embodiments described above, the present disclosure may also be applied to a display panel using light emitting elements such as organic electro luminescence (EL), inorganic EL, and light emitting polymer. Similarly to the exemplary embodiments described above, the present disclosure may also be applied to a display panel using a microcapsules containing colored liquid and white particles dispersed in the liquid.

In the description given above, a TFT is given as an example of the switching element. However, the switching element is not limited thereto, and may be, for example, a metal-oxide-semiconductor field-effect transistor (MOSFET).

What is claimed is:

1. An electro-optical device, comprising:
 a pixel electrode having translucency;
 a wiring layer including
  a translucent portion having translucency configured to overlap the pixel electrode in plan view in a thickness direction of the pixel electrode, and
  a wiring portion including a plurality of wirings arranged in a periphery of the translucent portion in the plan view;
 an insulating layer arranged between the pixel electrode and the wiring layer, and including a lens surface having a curved shape;
 a lens layer having translucency arranged between the pixel electrode and the insulating layer, and arranged on the insulating layer to be in contact with the lens surface;
 a first mark formed of a same layer as a part of the plurality of wirings of the wiring layer; and
 a second mark arranged in contact with the insulating layer on the lens layer side as viewed from the insulating layer.

2. The electro-optical device according to claim 1, wherein
 the wiring layer includes an insulating film having translucency,
 the first mark is configured to protrude from the insulating film toward the insulating layer, and
 the second mark is configured to protrude from the insulating layer toward the lens layer.

3. The electro-optical device according to claim 1, wherein
 light transmittance of the first mark is lower than light transmittance of the translucent portion, and
 light transmittance of the second mark is lower than light transmittance of the insulating layer.

4. The electro-optical device according to claim 1, wherein the second mark contains a metal material.

5. The electro-optical device according to claim 1, further comprising:
 a second insulating layer having translucency arranged between the wiring layer and the insulating layer; and
 a third mark arranged in contact with the insulating layer on the insulating layer side as viewed from the second insulating layer.

6. The electro-optical device according to claim 5, wherein the third mark is configured to overlap the first mark in the plan view.

7. The electro-optical device according to claim 1, further comprising:
 a base plate having translucency including a second lens surface having a curved shape, and arranged at an opposite side to the insulating layer as viewed from the wiring layer;

a second lens layer having translucency arranged between the wiring layer and the base plate, and arranged on the base plate to be in contact with the second lens surface;

an optical path adjusting layer arranged in contact with the wiring layer on the wiring layer side as viewed from the second lens layer, and configured to adjust an optical path length of light passing through the second lens surface;

a fourth mark arranged between the optical path adjusting layer and the base plate to be in contact with the base plate, and a fifth mark arranged between the wiring layer and the optical path adjusting layer to be in contact with the optical path adjusting layer.

8. The electro-optical device according to claim 7, wherein the second insulating layer includes a recessed portion, and the second lens surface is provided on a bottom surface of the recessed portion.

9. The electro-optical device according to claim 7, further comprising:

a third insulating layer having translucency including a third lens surface having a curved shape, and arranged between the optical path adjusting layer and the second lens layer;

a third lens layer having translucency arranged between the optical path adjusting layer and the third insulating layer, and arranged on the third insulating layer to be in contact with the third lens surface; and a sixth mark arranged between the optical path adjusting layer and the third insulating layer to be in contact with the third insulating layer.

10. The electro-optical device according to claim 1, wherein the pixel electrode and a part of the plurality of wirings are electrically coupled to each other via a through electrode passing through the insulating layer and the lens layer.

* * * * *